(12) United States Patent
Nishi

(10) Patent No.: US 11,374,119 B2
(45) Date of Patent: Jun. 28, 2022

(54) SEMICONDUCTOR DEVICE AND METHOD OF MANUFACTURING THE SAME

(71) Applicant: Mitsubishi Electric Corporation, Tokyo (JP)

(72) Inventor: Koichi Nishi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/943,527

(22) Filed: Jul. 30, 2020

(65) Prior Publication Data

US 2021/0134990 A1    May 6, 2021

(30) Foreign Application Priority Data

Nov. 1, 2019   (JP) ............................. JP2019-200072

(51) Int. Cl.
| | |
|---|---|
| *H01L 29/739* | (2006.01) |
| *H01L 29/40* | (2006.01) |
| *H01L 29/66* | (2006.01) |
| *H01L 29/423* | (2006.01) |
| *H01L 21/765* | (2006.01) |

(52) U.S. Cl.
CPC ........ *H01L 29/7397* (2013.01); *H01L 21/765* (2013.01); *H01L 29/407* (2013.01); *H01L 29/4236* (2013.01); *H01L 29/42364* (2013.01); *H01L 29/66348* (2013.01)

(58) Field of Classification Search
None
See application file for complete search history.

(56) References Cited

U.S. PATENT DOCUMENTS

| | | | |
|---|---|---|---|
| 2006/0065926 A1 | 3/2006 | Kubo et al. | |
| 2016/0190123 A1 | 6/2016 | Laven et al. | |
| 2017/0213908 A1* | 7/2017 | Fursin | H01L 29/0615 |
| 2020/0126973 A1* | 4/2020 | Kamibaba | H01L 27/0635 |

FOREIGN PATENT DOCUMENTS

| | | |
|---|---|---|
| JP | 2006-093506 A | 4/2006 |
| JP | 2016-154218 A | 8/2016 |
| JP | 2017-147431 A | 8/2017 |

* cited by examiner

*Primary Examiner* — Hsien Ming Lee
(74) *Attorney, Agent, or Firm* — Studebaker & Brackett PC

(57) ABSTRACT

A semiconductor device according to the present invention includes a semiconductor substrate including at least a first semiconductor layer of a second conductivity type, a second semiconductor layer of a first conductivity type, a third semiconductor layer of the second conductivity type, and a fourth semiconductor layer of the first conductivity type provided in the upper layer of the third semiconductor layer; a first gate trench extending in the thickness direction through the fourth, third, and second semiconductor layers to the inside of the first semiconductor layer; an interlayer insulating film; a first main electrode provided in contact with the fourth semiconductor layer; and a second main electrode provided on the side opposite the first main electrode. The first gate trench includes a first gate electrode on the lower side and a second gate electrode on the upper side.

24 Claims, 30 Drawing Sheets

F I G. 1
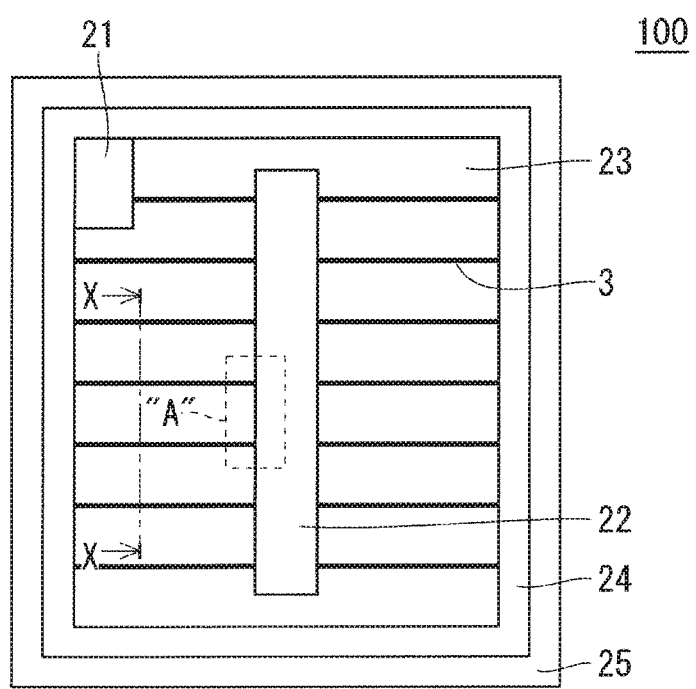

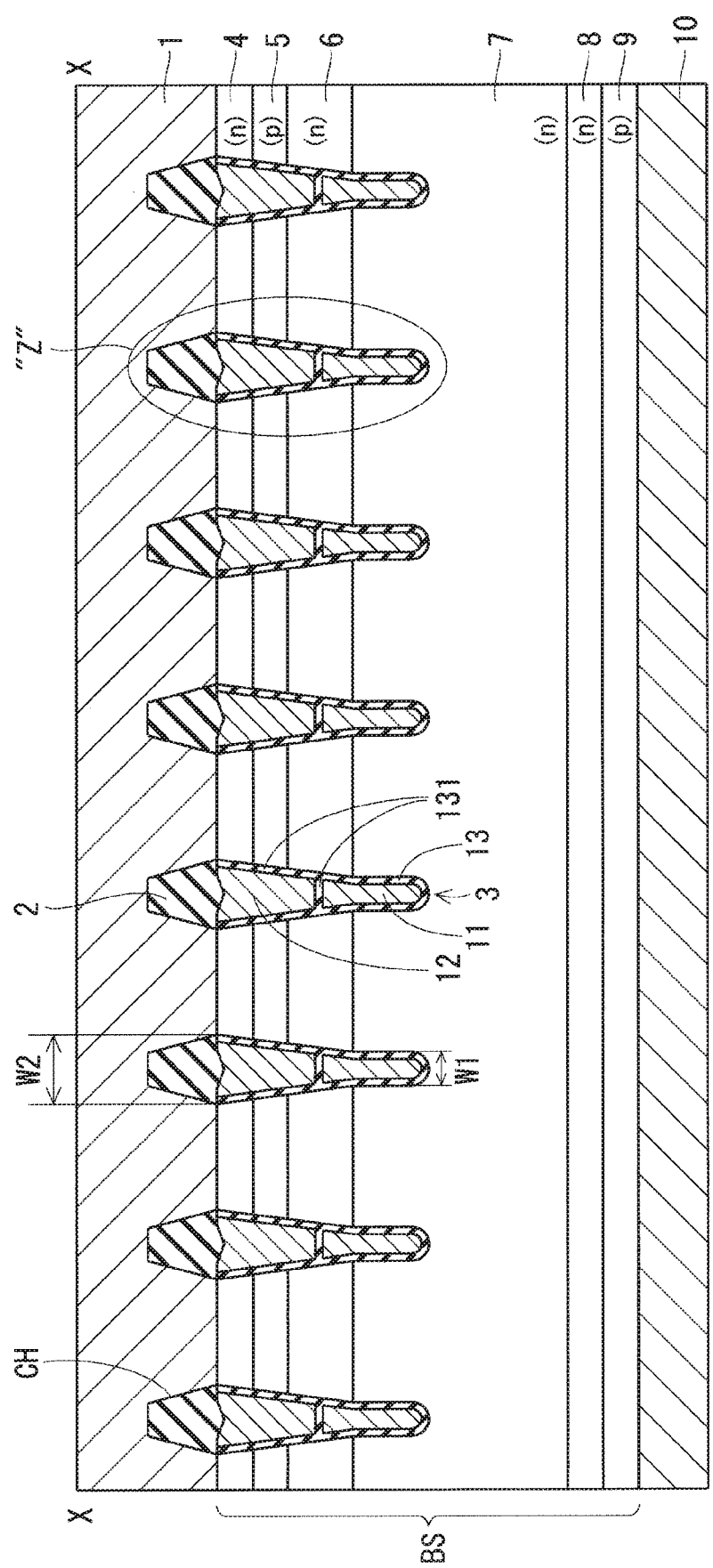

F I G. 2 1
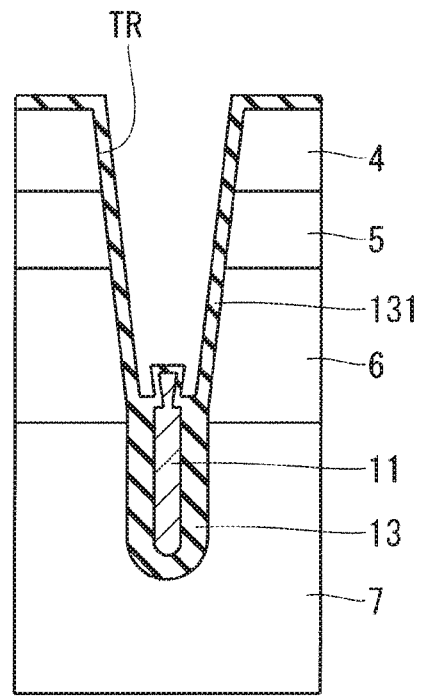
F I G. 2 2
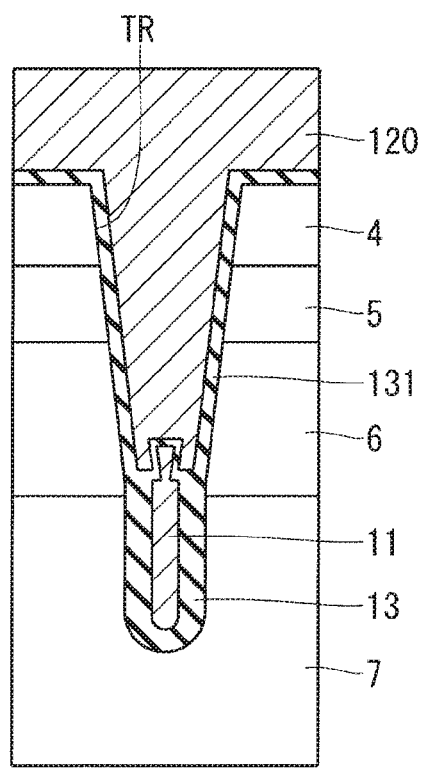

SEMICONDUCTOR DEVICE AND METHOD OF MANUFACTURING THE SAME

BACKGROUND OF THE INVENTION

Field of the Invention

The present invention relates to a semiconductor device, and in particular to a semiconductor device that suppresses leakage current from gate electrodes.

Description of the Background Art

From the viewpoint of reducing energy consumption, insulated gate bipolar transistors (IGBTs) and diodes are used in power modules for exercising variable-speed control over three-phase motors in fields such as general-purpose inverters and alternating-current (AC) servomotors. In order to reduce power loss, the IGBTs and the diodes are required to have low switching loss and low ON-state voltage.

Switching loss can be reduced by lowering feedback capacitances (gate-collector capacitances, i.e., G-C capacitances) of the IGBTs. For example, Japanese Patent Application Laid-open No. 2017-147431 discloses in its FIG. 12 a technique for reducing the feedback capacitances of IGBTs with use of two-stage structured trench gates.

With the technique disclosed in Japanese Patent Application Laid-open No. 2017-147431, however, leakage current may occur between an upper electrode at gate potential and a lower electrode at emitter potential.

SUMMARY

A semiconductor device is provided that is capable of suppressing leakage current from gate electrodes.

The semiconductor device according to the present invention includes a semiconductor substrate including at least a first semiconductor layer of a first conductivity type, a second semiconductor layer of the first conductivity type provided on the first semiconductor layer, a third semiconductor layer of a second conductivity type provided on the second semiconductor layer, and a fourth semiconductor layer of the first conductivity type provided in an upper layer portion of the third semiconductor layer; a first gate trench extending in a thickness direction of the semiconductor substrate through the fourth semiconductor layer, the third semiconductor layer, and the second semiconductor layer to an inside of the first semiconductor layer; an interlayer insulating film covering at least the first gate trench; a first main electrode provided in contact with the fourth semiconductor layer; and a second main electrode provided on a side of the semiconductor substrate opposite the first main electrode in the thickness direction. The first gate trench has a two-stage structure that includes a first gate electrode provided on a lower side close to the second main electrode, and a second gate electrode provided on an upper side close to the first main electrode. The first gate electrode is electrically connected to the first main electrode. An inner face of the first gate trench on the lower side is covered with a first gate insulating film. An upper face of the first gate electrode and a side face of the first gate trench on the upper side are covered with a second gate insulating film. The first gate insulating film has a thickness smaller than a thickness of the second gate insulating film.

The above-described semiconductor device can suppress the occurrence of leakage current between the first gate electrode and the second gate electrode because the first gate insulating film has a smaller thickness than the second gate insulating film.

BRIEF DESCRIPTION OF THE DRAWINGS

FIG. 1 is a plan view schematically illustrating a top configuration of a semiconductor device as a whole according to a first preferred embodiment of the present invention;

FIG. 2 is a sectional view illustrating the configuration of the semiconductor device according to the first preferred embodiment of the present invention;

FIGS. 16 to 23 are partial sectional views illustrating manufacturing steps in the case where the thickness of a gate insulating film in the lower portion of a gate trench is increased;

DESCRIPTION OF THE PREFERRED EMBODIMENTS

Beginning

Figure 3:
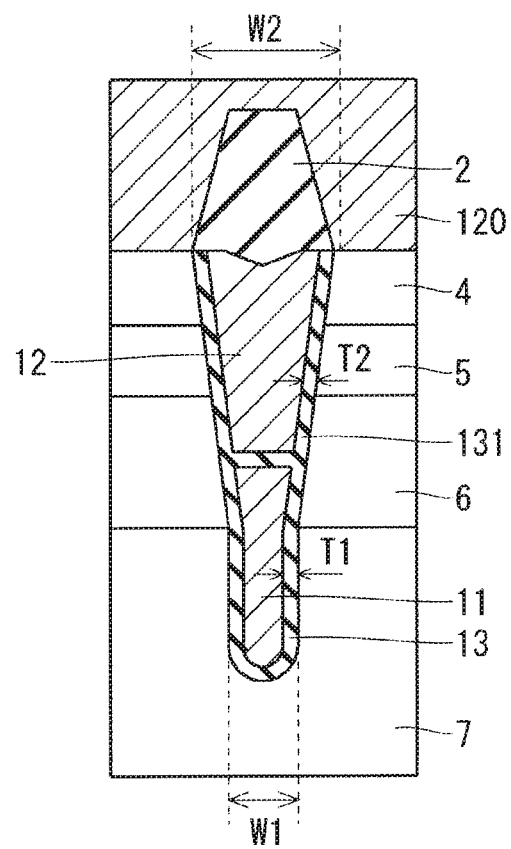
FIG. 3 is a partial enlarged view of the semiconductor device according to the first preferred embodiment of the present invention.

Preferred embodiments according to the present invention will be described hereinafter with reference to the accompanying drawings. Since the drawings are illustrated in schematic form, and the relative sizes and positions of images illustrated in different drawings are not always accurate and can be appropriately changed. In the following description, identical constituent elements are illustrated using the same reference signs and assumed to be identical in name and function. Thus, a detailed description thereof may be omitted in some cases.

In the following description, terms that may be used to mean specific positions and directions, such as "upper," "lower," "side," "bottom," "front," and "back," are merely used for convenience's sake in order to facilitate understanding of the content of the preferred embodiments, and do not relate to actual positions and directions during implementation. In the following description, the term "outer side" refers to a direction toward the outer periphery of a semiconductor device, and the term "inner side" refers to a direction opposite the direction corresponding to the "outer side."

In the following description, the conductivity of impurities is generally defined such that an n-type is a first conductivity type, and a p-type is a second conductivity type, but this definition may be reversed.

First Preferred Embodiment

Device Configuration

FIG. 1 is a plan view schematically illustrating a top configuration of an IGBT 100 as a whole according to a first preferred embodiment of the present invention. The IGBT 100 illustrated in FIG. 1 has a quadrangular outside shape, and its most part is configured of an active region 23 and a termination region 25 surrounding the outside of the active region 23, the active region 23 being a region through which principal current flows and that includes a plurality of smallest unit structures of the IGBT (IGBT cells) arranged therein, called "unit cells." In the active region 23, a plurality of gate trenches 3 is arranged at intervals in parallel. The IGBT 100 is a gate trench-type IGBT. The gate trenches 3 are connected to a gate line region 24 surrounding the active region 23, and the gate line region 24 is connected to a gate pad 21 provided in the active region 23. One ends of the gate trenches 3 are connected to the gate line region 24, and the other ends thereof extend to a rectangular line extraction region 22 provided extending in the direction of arrangement of the gate trench 3 in a central portion of the IGBT 100. The configuration of the line extraction region 22 will be described later.

The active region 23 is covered with an emitter electrode via an interlayer insulating film, except the tops of the gate line region 24 and the gate pad 21. For convenience's sake, the emitter electrode is not illustrated.

FIG. 2 is a sectional view taken along line X-X and viewed in the direction indicated by arrows in FIG. 1. As illustrated in FIG. 2, a semiconductor substrate BS of the IGBT 100 includes a p-type collector layer 9 (fifth semiconductor layer), an n-type buffer layer 8, an n-type drift layer 7 (first semiconductor layer), an n-type carrier storage layer 6 (second semiconductor layer), a p-type base layer 5 (third semiconductor layer), and an n-type emitter layer 4 (fourth semiconductor layer) provided in an upper layer portion of the base layer 5.

Assuming that one side of the semiconductor substrate BS close to the base layer 5 is defined as the upper side and the other side thereof close to the collector layer 9 as the lower side, the gate trenches 3 extending in a thickness direction from the outermost surface of the emitter layer 4 through the emitter layer 4, the base layer 5, and the carrier storage layer 6 to the inside of the drift layer 7 are provided in the upper part of the semiconductor substrate BS.

Each gate trench 3 (first gate trench) has a two-stage structure including a lower gate electrode 11 (first gate electrode) and an upper gate electrode 12 (second gate electrode), and the gate electrodes 11 and 12 are insulated from each other by a gate insulating film 131 (second gate insulating film).

The gate trench 3 is formed to have a bottom width W1 smaller than an opening width W2 and a tapered side face that tapers down toward the bottom. Tapering the side face of the gate trench so as to narrow the bottom width thereof improves the embeddability of the gate electrodes 11 and 12. If there is no problem with the embeddability of the gate electrodes 11 and 12, this tapering is not an absolute necessity.

The inner face in the lower part of the gate trench 3 is covered with a gate insulating film 13 (first gate insulating film), and the gate electrode 11 is provided in contact with the gate insulating film 13.

The upper face of the gate electrode 11 and the side face in the upper part of the gate trench 3 are covered with the gate insulating film 131, and the gate electrode 12 is provided in contact with the gate insulating film 131.

An interlayer insulating film 2 is provided to cover the tops of the gate trenches 3, and the intervals between the gate trenches 3, not covered with the interlayer insulating film 2, form contact openings CH. Moreover, an emitter electrode 1 (first main electrode) is provided to cover the interlayer insulating film 2 and the contact openings CH. Note that a collector electrode 10 (second main electrode) is provided on the main surface of the semiconductor substrate BS on the side opposite in the thickness direction to the side where the emitter electrode 1 is provided.

In the gate trenches 3, the bottom faces of the gate electrodes 12 are located inside the carrier storage layer 6, the upper faces of the gate electrodes 11 oppose the bottom faces of the gate electrodes 12 via the gate insulating films 131, and the bottom faces of the gate electrodes 11 oppose the drift layer 7 via the gate insulating films 13.

The gate electrodes 11 and 12 are formed of phosphorus (P)-doped polysilicon or metal. Using the doped polysilicon or metal to form the gate electrodes reduces the resistances of the gate electrodes and reduces variations in potential in the plane of a semiconductor chip.

FIG. 3 is a partial enlarged view of a region Z that surrounds one gate trench 3 in FIG. 2. As illustrated in FIG. 3, the gate insulating film 13 on the gate electrode 11 is formed to a thickness T1 smaller than a thickness T2 of the gate insulating film 131 on the gate electrode 12. As one example, the gate insulating film 13 has a thickness T1 of approximately 100 to 120 nm, and the gate insulating film 131 has a thickness T2 of approximately 110 to 130 nm. This is merely one example, and these thicknesses vary in the range of 10 to 500 nm depending on the rating of the IGBT 100. However, a difference in thickness between the gate insulating film 13 and the gate insulating film 131 is set approximately in the range of 5 to 20 nm.

The gate electrode 12 is connected to the gate potential, and the gate electrode 11 is connected to the emitter potential. The gate electrode 11 shields the gate electrode 12 from the drift layer 7, thereby reducing feedback capacitances. The reason for this will be described with reference to FIGS. 4 and 5.

Figure 4:
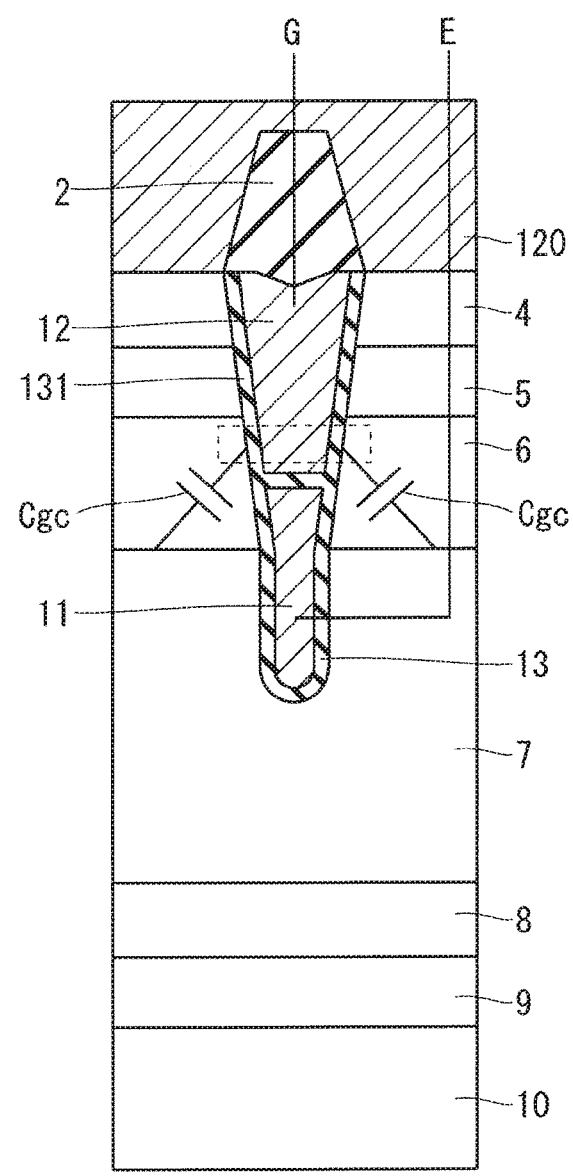
FIG. 4 is a diagram for describing the reason why feedback capacitances can be reduced in the semiconductor device according to the first preferred embodiment of the present invention.
Figure 5:
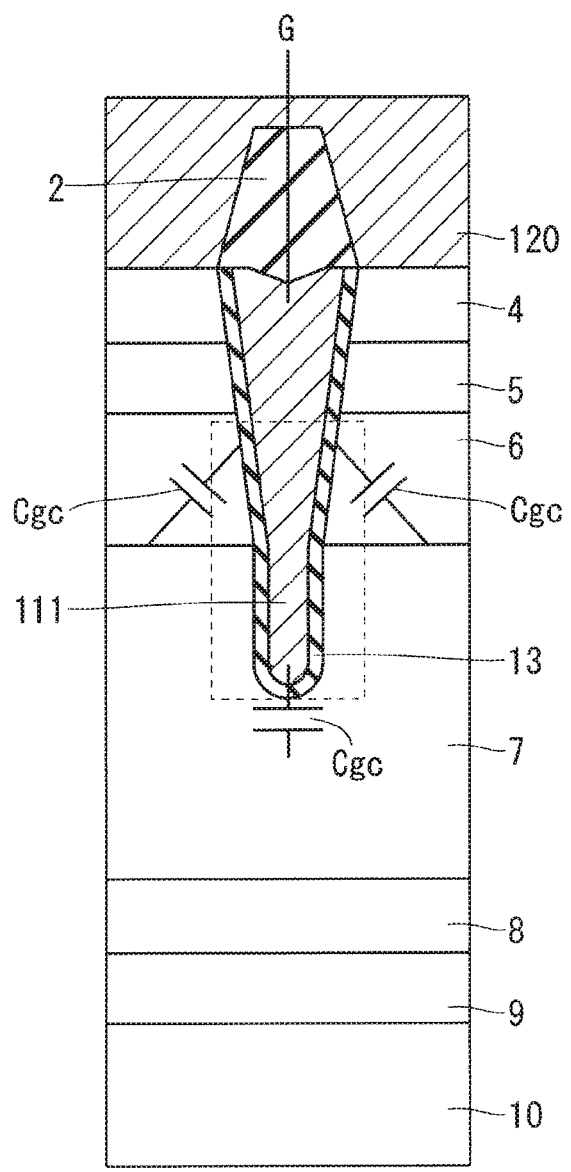
FIG. 5 is a diagram for describing the reason why feedback capacitances can be reduced in the semiconductor device according to the first preferred embodiment of the present invention.

FIG. 4 is a diagram schematically illustrating feedback capacitances (gate-collector capacitances, i.e., Cgc) of a two-stage structured gate trench similar to the gate trenches 3, and FIG. 5 is a diagram schematically illustrating feedback capacitances of a gate trench that does not have a two-stage structure.

In FIGS. 4 and 5, regions of the gate trenches that function as the feedback capacitances (Cgc) are indicated by broken lines. The feedback capacitances Cgc are configured of the semiconductor layer, the gate insulating film, and the gate electrode that are arranged below the base layer 5. In the two-stage structured gate trench, the lower gate electrode 11 does not function as Cgc because the lower gate electrode 11 is connected to the emitter potential (E) and only the upper gate electrode 12 is connected to the gate potential (G). Accordingly, it is possible to reduce Cgc. In the gate trench that does not have a two-stage structure as illustrated in FIG. 5, a gate electrode 111 as a whole is connected to the gate potential, and a lower part of the gate electrode 111 opposes the drift layer 7 and serves as Cgc. Therefore, Cgc increases.

Figure 6:
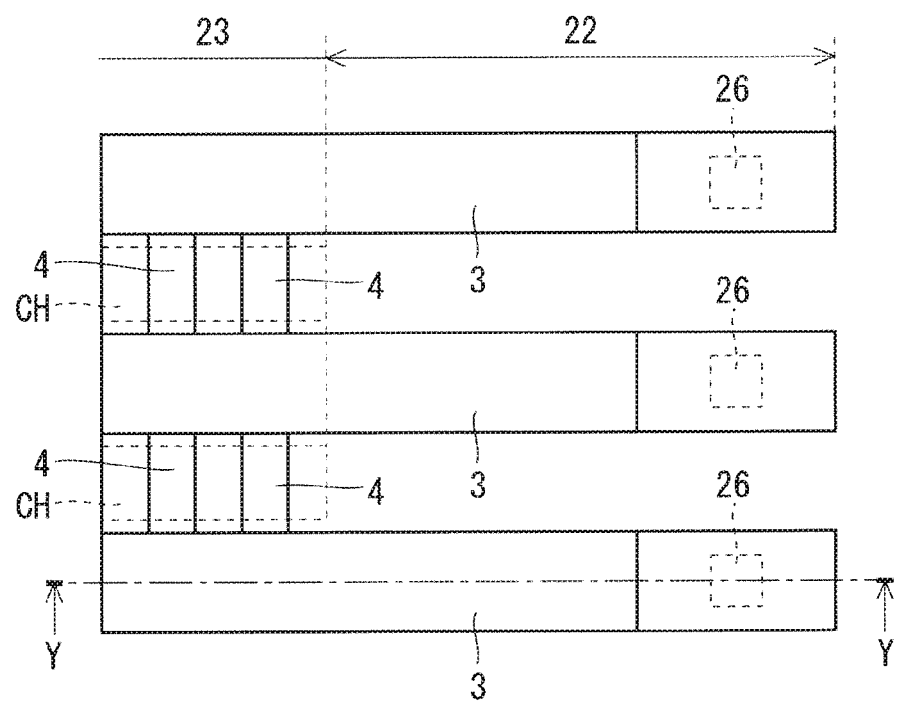
FIG. 6 is a plan view for describing a configuration in which gate electrodes are connected to the emitter potential in the semiconductor device according to the first preferred embodiment of the present invention.

Next, a configuration in which the gate electrodes 11 are connected to the emitter potential will be described with reference to FIGS. 6 and 7. FIG. 6 is a partial enlarged view of a region A that includes the line extraction region 22 in the plan view in FIG. 1, and FIG. 7 is a sectional view taken along line Y and Y and viewed in the direction indicated by arrows in FIG. 6.

Part of the line extraction region 22 and the active region 23 therearound are illustrated in FIG. 6, in which contact holes 26 are provided in the end portions of the gate trenches 3 in the line extraction region 22. The contact holes 26 are connected to the emitter electrode 1 (not shown).

Figure 7:
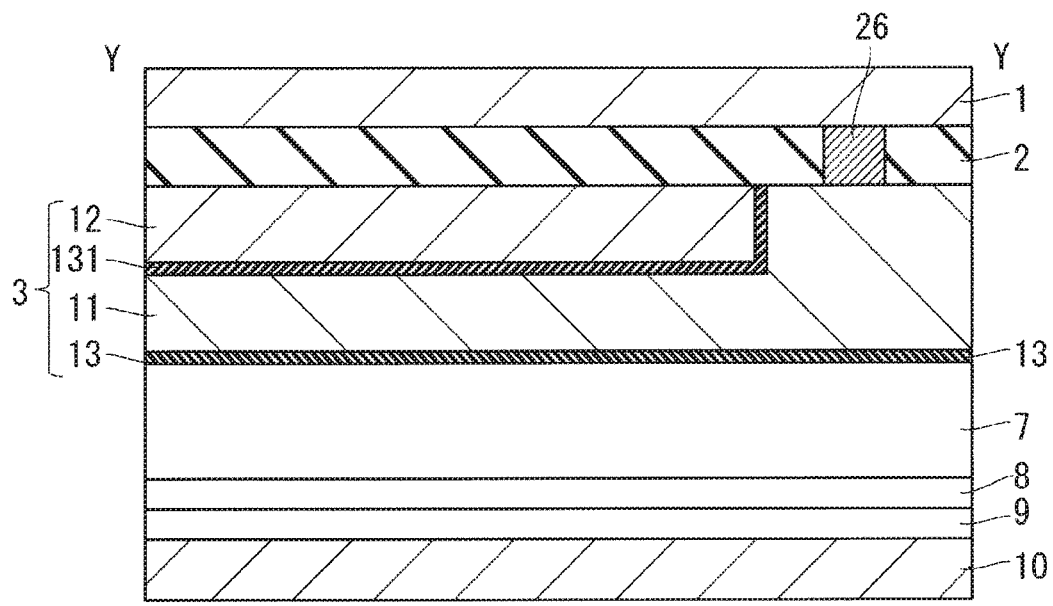
FIG. 7 is a sectional view for describing the configuration in which a gate electrode is connected to the emitter potential in the semiconductor device according to the first preferred embodiment of the present invention.

As illustrated in FIG. 7, in the end portion of the gate trench 3 where the contact hole 26 is provided, the gate electrode 11 extends upward so as to come in contact with the interlayer insulating film 2 and is connected to the contact hole 26 provided in the thickness direction through the interlayer insulating film 2.

Since the contact hole 26 is connected to the emitter electrode 1, the gate electrode 11 is connected to the emitter potential and stabilizes in terms of its potential. The gate electrode 12 is electrically isolated from the gate electrode 11 by the gate insulating film 131 and electrically connected to the gate line region 24 at the end of the gate trench 3 on side opposite the side where the contact hole 26 is provided.

By employing this plan configuration, it is possible to fix the potentials of the gate electrodes 11 to the emitter potential and to stabilize these gate electrodes in terms of their potential. Moreover, the presence of the line extraction region 22 in the central portion of the IGBT 100 eliminates the need to distribute the line extraction region 22. There is also the effect of reducing the area of the line extraction region 22 and reducing the size of a semiconductor chip.

Manufacturing Method

As described previously, the gate insulating film 13 on the gate electrode 11 is formed to the thickness T1 smaller than the thickness T2 of the gate insulating film 131 on the gate electrode 12. Forming the gate insulating film 13 thinner than the gate insulating film 131 produces the effect of suppressing the occurrence of leakage current between the gate electrodes 12 and 11. This effect will be described hereinafter.

First, a method of manufacturing the IGBT 100 will be described with reference to partial sectional views in FIGS. 8 to 15 that illustrate manufacturing steps in sequence. The following description focuses on the steps of manufacturing the gate trench 3.

Figure 8:
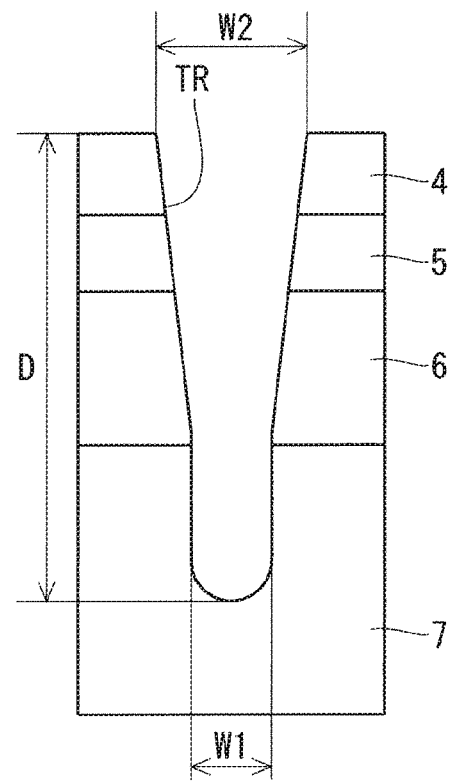
FIGS. 8 to 15 are partial sectional views illustrating steps of manufacturing the semiconductor device according to the first preferred embodiment of the present invention.

In the step illustrated in FIG. 8, a trench TR that extends in the thickness direction from the outermost layer of the emitter layer 4 through the emitter layer 4, the base layer 5, and the carrier storage layer 6 to the inside of the drift layer 7 is formed by etching. This etching may be dry etching or wet etching. Since conventional etching techniques can be used to form this trench, a description of the details such as etching conditions will be omitted, but this etching is performed while controlling etching conditions such that the trench TR has a tapered side face that tapers down toward the bottom. As one example of the dimensions, the trench TR has a bottom width W1 of approximately 0.8 to 1.0 μm, an opening width W2 of approximately 1.2 to 1.5 μm, and a depth D of approximately 4 to 6 μm. This is merely one example, and these widths may vary in the range of 0.3 to 3.0 μm and the depth may vary in the range of 1.0 to 10 μm, depending on the rating of the IGBT 100. The taper angle is approximately 80 degrees and more desirably in the range of 70 to 89 degrees with respect to a horizontal plane.

Figure 9:
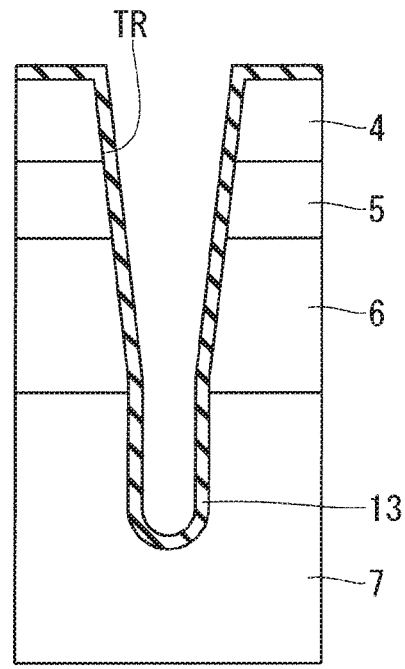

Then, in the step illustrated in FIG. 9, the gate insulating film 13 with a thickness of approximately 100 nm is formed on the inner face of the trench TR and on the emitter layer 4 by, for example, thermal oxidation. Note that the formation method is not limited to thermal oxidation, and the gate insulating film 13 may be formed by depositing a silicon oxide film by chemical vapor deposition (CVD) or other methods.

Figure 10:
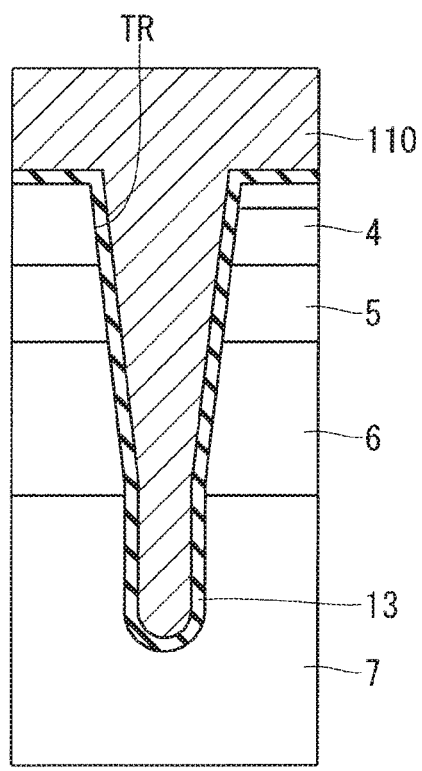

Then, in the step illustrated in FIG. 10, the trench TR is filled with a conductive film 110 formed of phosphorus-doped polysilicon or metal by depositing the conductive film 110 on the emitter layer 4 by, for example, CVD.

Figure 11:
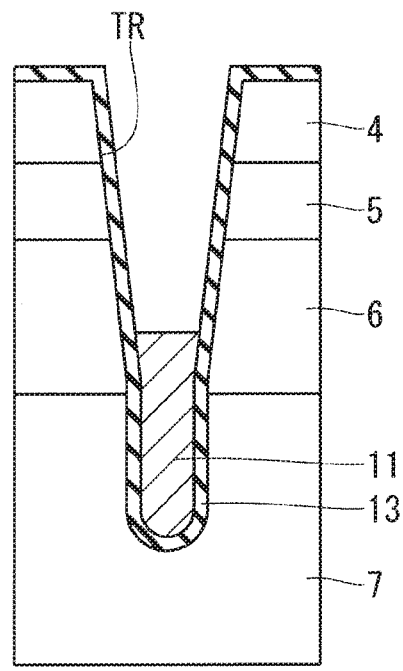

Then, in the step illustrated in FIG. 11, the gate electrode 11 is formed by removing the conductive film 110 on the emitter layer 4 by etching and also removing the conductive film 110 in the trench TR to such a height that the top end of the conductive film 110 is located in the carrier storage layer 6.

Figure 12:
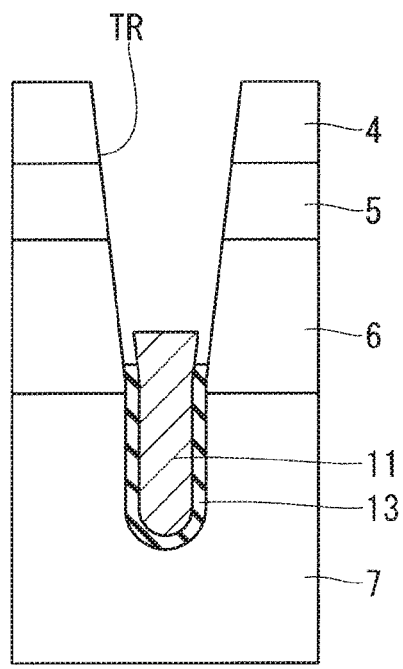

Then, in the step illustrated in FIG. 12, a portion of the gate insulating film 13 that is above the gate electrode 11 is removed by etching. This etching may be dry etching or wet etching, and any conventional etching technique can be used. At this time, a portion of the gate insulating film 13 that is adjacent to the top end of the gate electrode 11 is removed by intentional overetching, so that the end face of the gate insulating film 13 is located below the top end of the gate electrode 11.

Figure 13:
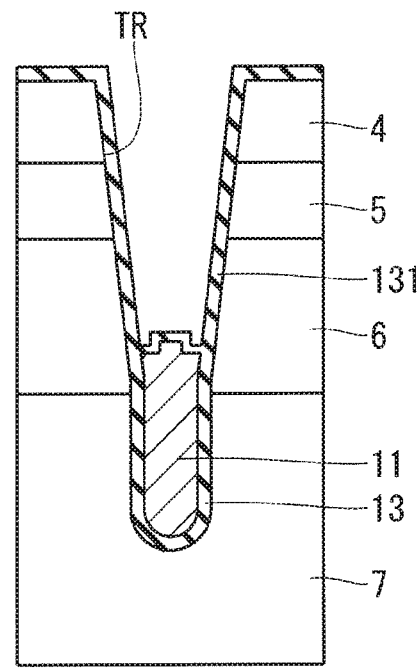

Then, in the step illustrated in FIG. 13, the gate insulating film 131 with a thickness of approximately 110 nm is formed on the inner face of the trench TR and on the emitter layer 4 by, for example, thermal oxidation. Due to the aforementioned overetching, this gate insulating film 131 becomes embedded in the portion where the end face of the gate insulating film 13 is located below the top end of the gate electrode 11, and has a shape such that its bottom face has a downwardly recessed edge and a protrusion in the center. The thickness of the gate insulating film 131 may also vary in the range of 10 to 500 nm depending on the rating of the IGBT 100.

Figure 14:
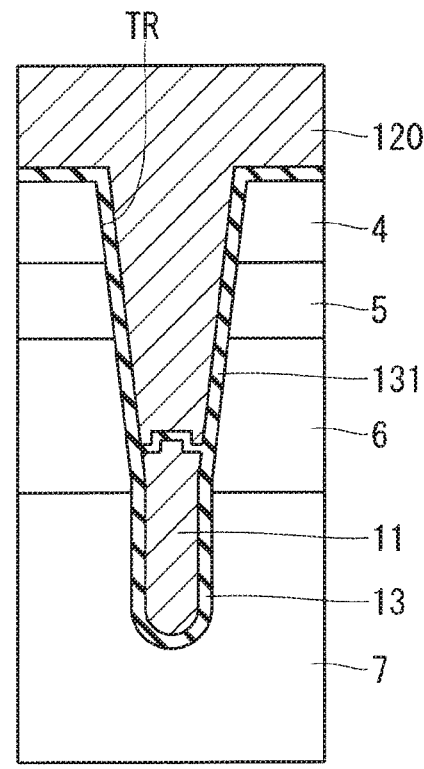

Then, in the step illustrated in FIG. 14, the trench TR is filled with a conductive film 120 formed of phosphorus-doped polysilicon or metal by depositing the conductive film 120 on the emitter layer 4 by, for example, CVD.

Figure 15:
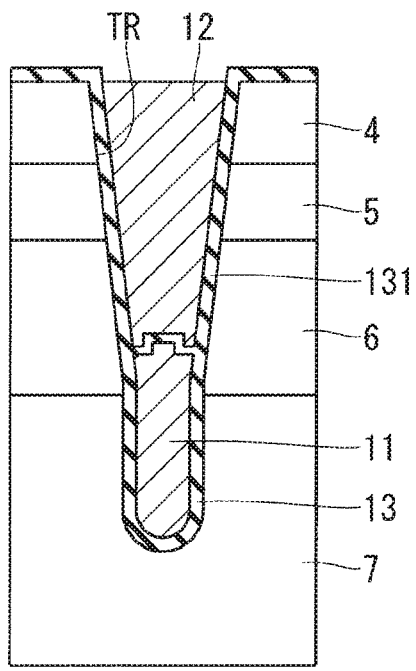

Then, in the step illustrated in FIG. 15, the conductive film 120 on the emitter layer 4 is removed, and the gate electrode 12 is formed. The gate electrode 12 formed in this way has such a shape that its bottom face protrudes upward in accordance with the shape of the bottom face of the gate insulating film 131.

This protrusion on the bottom face of the gate electrode 12 forms neither a deep recess nor a sharp edge resulting from the formation of the gate insulating film 13 that is thinner than the gate insulating film 131. In FIGS. 2 and 3, the protrusions on the bottom faces of the gate electrodes 12 are not illustrated for conveniences sake.

Next, as a comparative example, steps of manufacturing a gate trench 3 in which the gate insulating film 13 is formed thicker than the gate insulating film 131 will be described with reference to FIGS. 16 to 23. Note that redundant descriptions of the steps described with reference to FIGS. 8 to 15 will be omitted.

Figure 16:
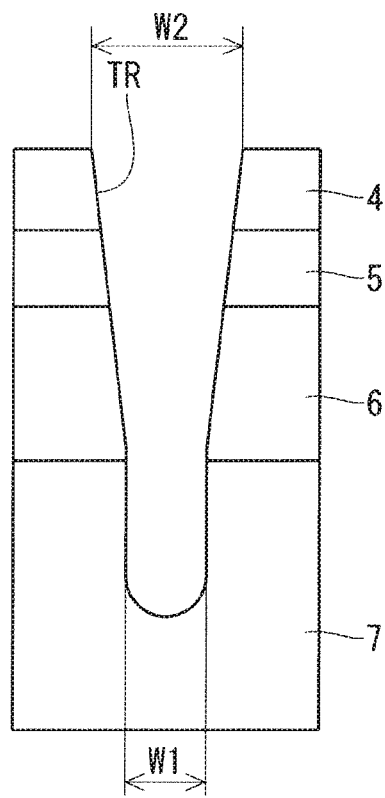

In the step illustrated in FIG. 16, a trench TR that extends in the thickness direction from the outermost surface of the emitter layer 4 through the emitter layer 4, the base layer 5, and the carrier storage layer 6 to the inside of the drift layer 7 is formed by etching. This step is the same as the step described with reference to FIG. 8.

Figure 17:
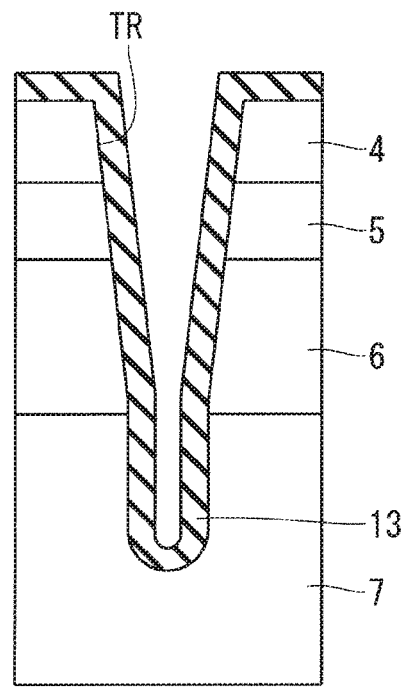

Then, in the step illustrated in FIG. 17, the gate insulating film 13 with a thickness of approximately 200 nm is formed on the inner face of the trench TR and on the emitter layer 4 by, for example, thermal oxidation.

Figure 18:
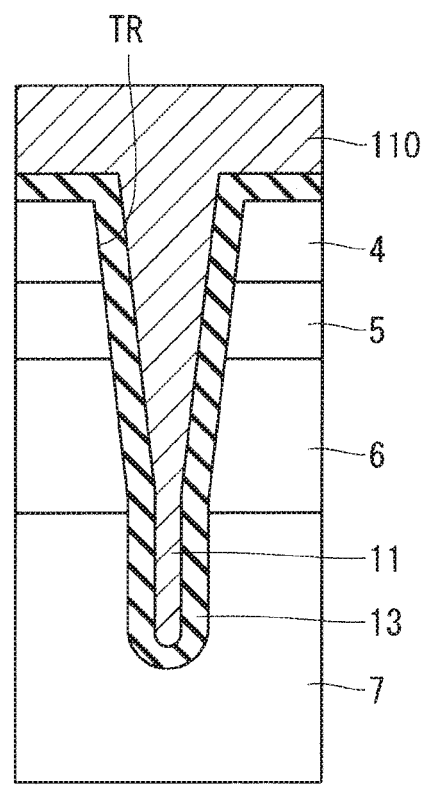

Then, in the step illustrated in FIG. 18, the trench TR is filled with the conductive film 110 formed of phosphorus-doped polysilicon or metal by depositing the conductive film 110 on the emitter layer 4 by, for example, CVD.

Figure 19:
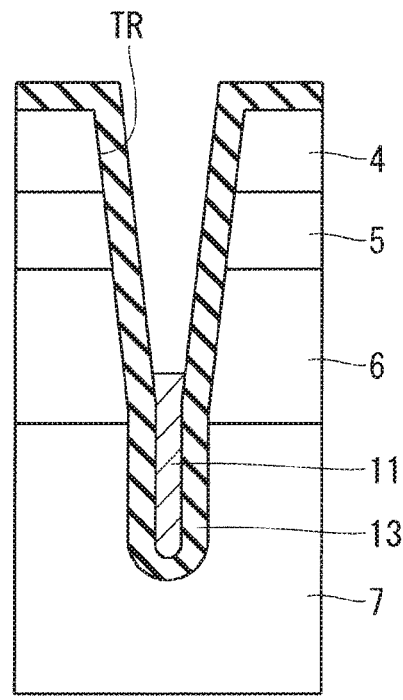

Then, in the step illustrated in FIG. 19, the gate electrode 11 is formed by removing the conductive film 110 on the emitter layer 4 by etching and also removing the conductive film 110 in the trench TR to such a height that the top end of the conductive film 110 is located in the carrier storage layer 6.

Figure 20:
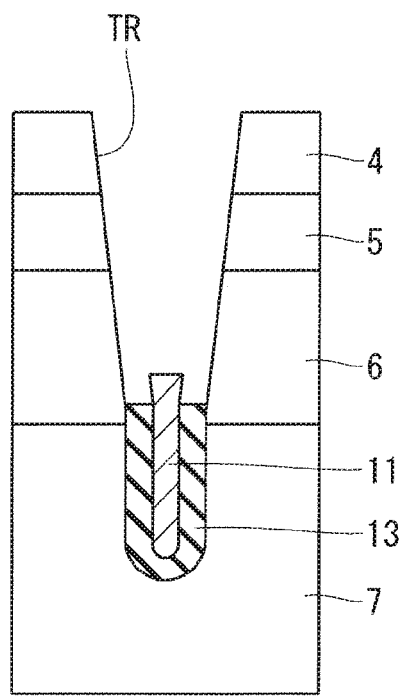

Then, in the step illustrated in FIG. 20, a portion of the gate insulating film 13 that is above the gate electrode 11 is removed by etching. At this time, a portion of the gate insulating film 13 that is adjacent to the top end of the gate electrode 11 is removed by intentional overetching, so that the end face of the gate insulating film 13 is located below the top end of the gate electrode 11. In this case, the amount of removal by overetching is greater than in the case in FIG. 12 because the gate insulating film 13 has a greater thickness.

Then, in the step illustrated in FIG. 21, the gate insulating film 131 with a thickness of approximately 110 nm is formed on the inner face of the trench TR and on the emitter layer 4 by, for example, thermal oxidation. Due to the aforementioned overetching, this gate insulating film 131 becomes embedded in the portion where the end face of the gate insulating film 13 is located below the top end of the gate electrode 11, and has such a shape that its bottom face has a downwardly recessed edge and a protrusion in the center, but the edge of the bottom face is recessed to a greater extent.

Then, in the step illustrated in FIG. 22, the trench TR is filled with the conductive film 120 formed of phosphorus-doped polysilicon or metal by depositing the conductive film 120 on the emitter layer 4 by, for example, CVD.

Figure 23:
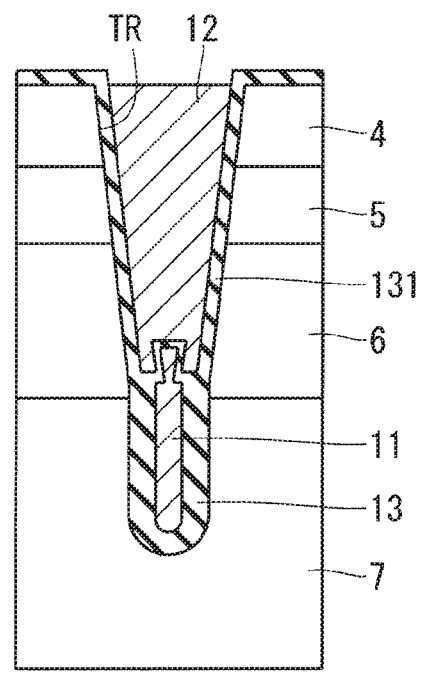

Then, in the step illustrated in FIG. 23, the conductive film 120 on the emitter layer 4 is removed, and the gate electrode 12 is formed. The gate electrode 12 formed in this way has such a shape that its bottom face has an upward protrusion in accordance with the shape of the bottom face of the gate insulating film 131, but the protrusion on the bottom face forms a deeper and wider recess and sharp edges. As a result, leakage current increases because the opposing area of the gate electrodes 11 and 12 increases and it becomes difficult to control the thickness of the bottom face of the gate insulating film 131.

In other words, it can be said that leakage current can be reduced by reducing the thickness of the gate insulating film 13 as described with reference to FIGS. 8 to 15, because the protrusion on the bottom face of the gate electrode 12 forms neither a deep recess nor a sharp edge resulting from overetching, the opposing area of the gate electrodes 11 and 12 does not increase, and it becomes easy to control the thickness of the bottom face of the gate insulating film 131.

Figure 24:
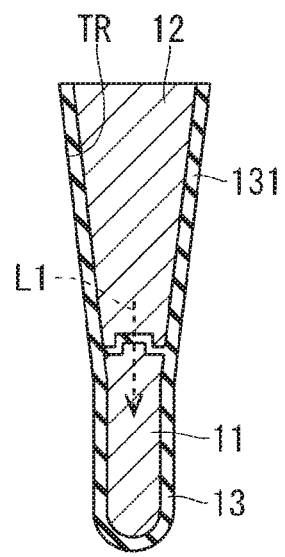
FIGS. 24 and 25 are diagrams for describing leakage current paths between gate electrodes.

Here, a leakage current path between the gate electrodes 11 and 12 will be described with reference to FIGS. 24 and 25. In FIG. 24, a leakage current path L1 is illustrated as a path extending through the gate insulating film 131 between the gate electrodes 11 and 12. If this portion is thick, leakage can be suppressed. Therefore, the thickness of the gate insulating film 131 is desirably greater than the thickness of the gate insulating film 13.

Figure 25:
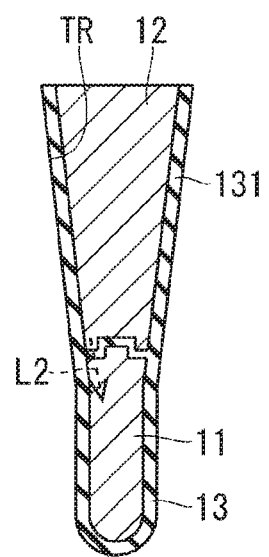

In FIG. 25, a leakage current path L2 is illustrated as a path extending through the corner of the recess at the edge of the bottom face of the gate insulating film 131. If this portion does not have an acute angle, leakage can be suppressed. In order to reduce the depth of this recess, the thickness of the gate insulating film 13 should be made smaller, and it is desirable that the thickness of the gate insulating film 13 is as small as possible.

If the thickness of the gate insulating film 131 is increased so as to fill the protrusion at the top end of the gate electrode 11, the gate insulating film 131 will not have a recess at the edge of the bottom face, and it is possible to suppress both of leakage through the leakage current path L2 and leakage through the leakage current path L1.

As described above, the IGBT 100 according to the first preferred embodiment of the present invention can suppress leakage current between the gate electrodes 11 and 12 by forming the gate insulating film 13 on the gate electrode 11 thinner than the gate insulating film 131 on the gate electrode 12.

In order to form the gate insulating film 13 and the gate insulating film 131 to have different thicknesses, different formation conditions (oxidation conditions or deposition conditions) may be set for each gate insulating film. For example, thicknesses can be changed by changing the oxidation time or the deposition time.

Alternatively, in the case of using the same oxidation or deposition conditions, a difference in the rate of oxidation or deposition in the trench may be used to obtain different thicknesses. That is, since the amount of inflow of an oxidation gas or a deposition gas differs between the opening side and bottom side of the trench and accordingly the oxidation or deposition rate on the bottom side of the trench is smaller than that on the opening side, the thickness of the gate insulating film 13 can be reduced even within the same processing time.

In the IGBT 100, each gate trench 3 has a two-stage structure in which the bottom face of the gate electrode 12 is located in the carrier storage layer 6 and the upper face of the gate electrode 11 opposes the bottom face of the gate electrode 12 via the gate insulating film 131. Accordingly, it is possible to reduce feedback capacitances and to reduce switching loss.

Second Preferred Embodiment

Figure 26:
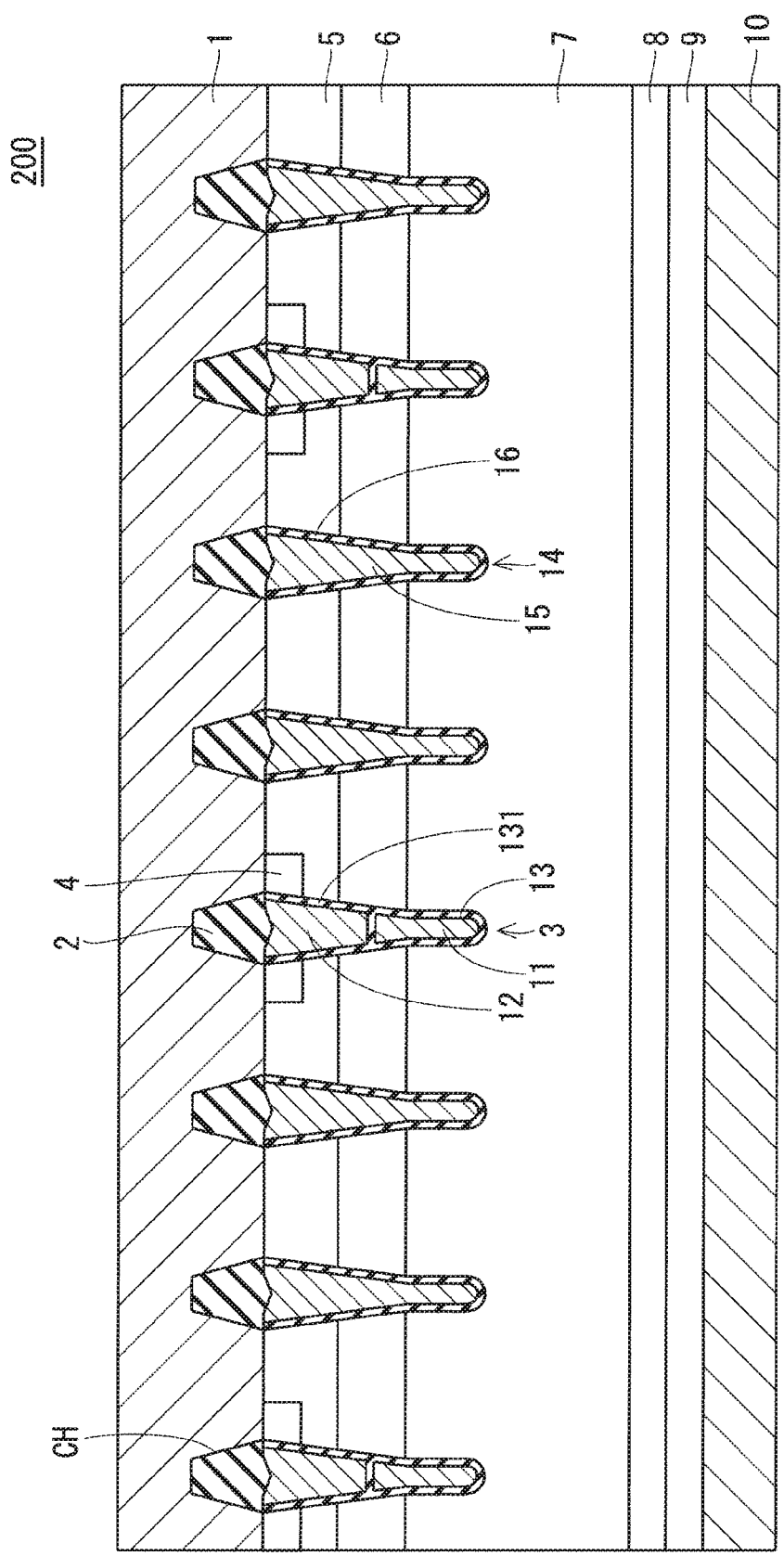
FIG. 26 is a sectional view illustrating a configuration of a semiconductor device according to a second preferred embodiment of the present invention.

FIG. 26 is a sectional view illustrating a sectional configuration of an IGBT 200 according to a second preferred embodiment of the present invention, the sectional view corresponding to the sectional view of the IGBT 100 illustrated in FIG. 2. In FIG. 26, constituent elements that are identical to those of the IGBT 100 described with reference to FIG. 2 are given the same reference signs, and a redundant description thereof will be omitted.

As illustrated in FIG. 26, the IGBT 200 includes a plurality of gate trenches 14 (second gate trenches), in addition to the plurality of gate trenches 3, and has a configuration in which two gate trenches 14 are arranged between each pair of adjacent gate trenches 3. Note that the arrangement of the gate trenches 3 and the gate trenches 14 are not limited thereto.

The gate trenches 14 are provided extending in the thickness direction from the outermost surface of the base layer 5 through the base layer 5 and the carrier storage layer 6 to the inside of the drift layer 7. The emitter layer 4 is not provided outside the side faces of the gate trenches 14, and is selectively provided only in contact with the gate trenches 3.

Each gate trench 3 has a two-stage structure including the gate electrode 11 and the gate trench 12, whereas each gate trench 14 has a structure including a gate electrode 15 (third gate electrode) connected to the emitter potential.

The gate trench 14 has the same outside shape as that of the gate trench 3, and has a tapered side face that tapers down toward the bottom. Tapering the side face of the gate trench so as to narrow the bottom width thereof improves the embeddability of the gate electrode 15. If there is no problem with the embeddability of the gate electrode 15, this tapering is not an absolute necessity.

The inner face of the gate trench 14 is covered with a gate insulating film 16 (third gate insulating film), and the gate electrode 15 is provided in contact with the gate insulating film 16.

Moreover, the interlayer insulating film 2 is provided so as to cover the tops of the gate trenches 3 and 14, and the intervals between the gate trenches 14 and between the gate trenches 3 and the gate trenches 14, not covered with the interlayer insulating film 2, form the contact openings CH. The emitter electrode 1 is further provided to cover the interlayer insulating film 2 and the contact openings CH.

Since the gate trenches 14 are not in contact with the emitter layer 4 and the gate electrodes 15 are connected to the emitter potential, the gate trenches 14 do not function as gate trenches and thus be referred to as "dummy gate trenches."

Since the gate electrodes 15 do not function as gate electrodes and do not form capacitance components with the base layer 5, the carrier storage layer 6, and the drift layer 7, it is possible to reduce feedback capacitances of a semiconductor chip as a whole.

The gate electrodes 15 are formed of phosphorus-doped polysilicon or metal. Using the doped polysilicon or metal to form the gate electrode reduces the resistances of the gate electrodes and reduces variations in potential in the plane of a semiconductor chip.

Even with the presence of the gate trenches 14, the IGBT 200 can be set to the same current rating as that of the IGBT 100 with use of an equivalent area by setting the intervals at which the emitter layer 4 is provided in the direction of extension of the gate trenches 3 in such a manner that a total channel width of channels formed in the base layer 5 remains the same as that in the IGBT 100.

Third Preferred Embodiment

Figure 27:
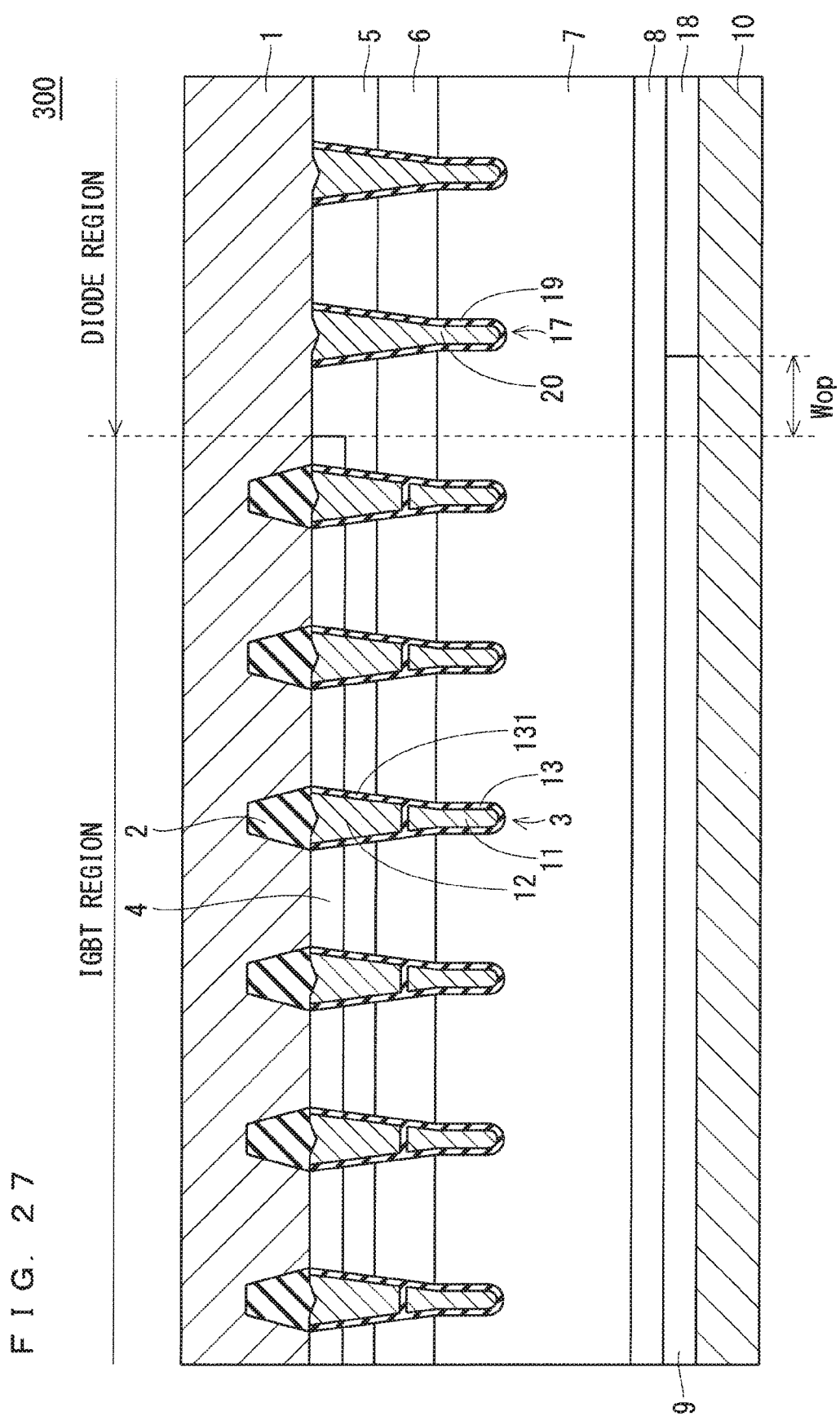
FIG. 27 is a sectional view illustrating a configuration of a semiconductor device according to a third preferred embodiment of the present invention.

FIG. 27 is a sectional view illustrating a sectional configuration of a reverse conducting IGBT (RC-IGBT) 300 according to a third preferred embodiment of the present invention. In FIG. 27, constituent elements that are identical to those of the IGBT 100 described with reference to FIG. 2 are given the same reference signs, and a redundant description thereof will be omitted.

As illustrated in FIG. 27, the RC-IGBT 300 includes an IGBT region (first semiconductor element region) in which an IGBT is formed, and a diode region (second semiconductor element region) in which a reverse conducting diode is formed. The configuration of the IGBT region is the same as that of the IGBT 100 illustrated in FIG. 2. In the diode region, on the other hand, the p-type collector layer 9 is replaced by an n-type cathode layer 18 (sixth semiconductor layer). The diode region also does not include the emitter layer 4, and includes a plurality of gate trenches 17 (third gate trenches) provided extending in the thickness direction from the outermost surface of the base layer 5 through the base layer 5 and the carrier storage layer 6 to the inside of the drift layer 7.

The gate trenches 3 each have a two-stage structure including the gate electrode 11 and the gate trench 12, whereas the gate trenches 17 each have a structure including a gate electrode 20 (fourth gate electrode) that is directly connected to the emitter electrode 1.

The emitter electrode 1 is provided also to cover the upper face of the base layer 5 that includes the upper faces of the gate electrodes 20 in the gate trenches 17 in the diode region. In the diode region, the emitter electrode 1 functions as the anode electrode of the reverse conducting diode.

Each gate trench 17 has the same outside shape as that of the gate trenches 3, and has a tapered side face that tapers down toward the bottom. Tapering the side face of the gate trench so as to narrow the bottom width thereof improves the embeddability of the gate electrode 20. If there is no problem with the embeddability of the gate electrode 20, this tapering is not an absolute necessity.

The inner face of the gate trench 17 is covered with a gate insulating film 19 (fourth gate insulating film), and the gate electrode 20 is provided in contact with the gate insulating film 19.

The gate electrodes 20 are in contact with the emitter electrode 1, i.e., the anode electrode, and do not function as gate electrodes. Thus, the gate trenches 17 can be referred to as "dummy gate trenches."

The gate electrodes 20 are formed of phosphorus-doped polysilicon or metal. Using the doped polysilicon or metal to form the gate electrodes reduces the resistances of the gate electrodes and reduces variations in potential in the plane of a semiconductor chip.

Here, the collector layer 9 has a projecting portion that projects with a width Wop toward the diode region beyond the position of the end face of the emitter layer 4 in the IGBT region. The presence of the projecting portion reduces the amount of electrons flowing between the emitter layer 4 at the edge of the IGBT region and the cathode layer 18 at the edge of the diode region, and thereby suppresses an increase in the ON-state voltage of the IGBT.

Figure 28:
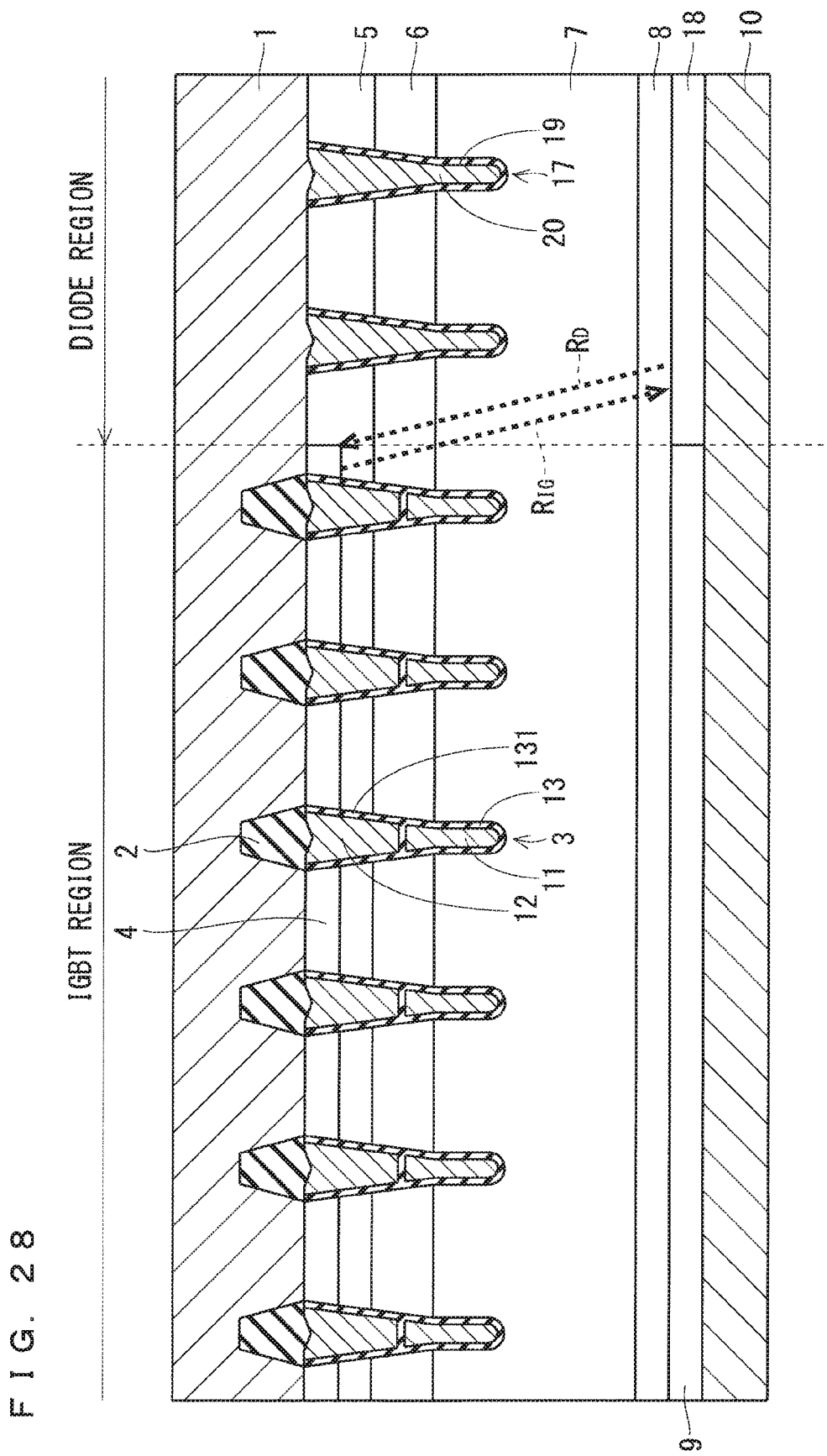
FIG. 28 is a diagram for describing an effect achieved by the presence of a projecting portion of a collector layer.

Here, the effect achieved by the presence of the projecting portion of the collector layer 9 will be described with reference to FIG. 28. FIG. 28 is a sectional view illustrating a case where the collector layer 9 does not have a projecting portion, and the end face of the collector layer 9 is located at the same position as the end face of the emitter layer 4. With this structure, electrons emitted from the cathode layer 18 during the operation of the diode come out into the emitter layer 4 in the IGBT region through a path $R_D$, and accordingly holes are not supplied from the anode electrode. Moreover, during the operation of the IGBT, electrons emitted from the emitter layer 4 come out into the cathode layer 18 through a path $R_{IG}$, and accordingly holes are not supplied from the collector layer 9. Consequently, there is a possibility of an increase in the ON-state voltage of the IGBT. However, the presence of the projecting portion of the collector layer 9 as illustrated in FIG. 27 makes distant the position of the end face of the cathode layer 18 in the diode region from the IGBT region, thereby suppressing the flow of electrons between the emitter layer 4 at the edge of the IGBT region and the cathode layer 18 at the edge of the diode region and suppressing an increase in the ON-state voltage of the IGBT.

Here, the projecting width Wop of the collector layer 9 may take a zero value or any of positive and negative values. That is, if the aforementioned increase in the ON-state voltage of the IGBT is ignorable, the width Wop may be zero, and if it is necessary to further suppress an increase in the ON-state voltage of the IGBT, the projecting width Wop may be increased in the positive direction (increment direction). If it is necessary to reduce the ON-state voltage of the diode, the projecting width Wop may be increased in the negative direction (decrement direction).

As described above, the RC-IGBT 300 according to the third preferred embodiment of the present invention can suppress leakage current between the gate electrodes 11 and 12 and can reduce feedback capacitances and switching loss, as a result of the inclusion of the IGBT region having the same configuration as that of the IGBT 100 illustrated in FIG. 2.

Moreover, by providing the projecting portion of the collector layer 9 in the diode region, the RC-IGBT 300 can suppress the flow of electrons between the emitter layer 4 at the edge of the IGBT region and the cathode layer 18 at the edge of the diode region and thereby can suppress a reduction in the ON-state voltage of the IGBT.

Fourth Preferred Embodiment

Figure 29:
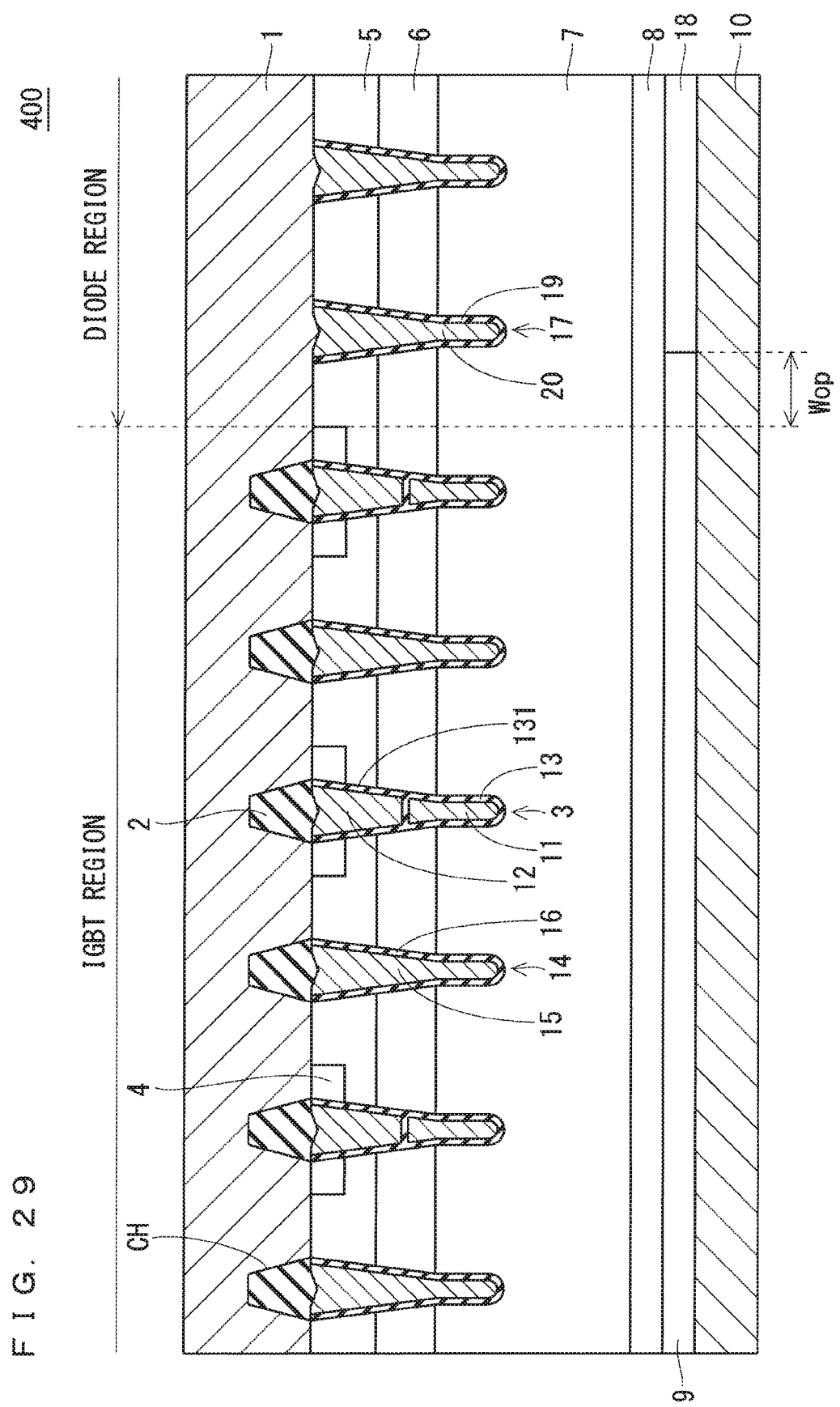
FIG. 29 is a sectional view illustrating a configuration of a semiconductor device according to a fourth preferred embodiment of the present invention.

FIG. 29 is a sectional view illustrating a sectional configuration of an RC-IGBT 400 according to a fourth preferred embodiment of the present invention. In FIG. 29, constituent elements that are identical to those of the RC-IGBT 300 described with reference to FIG. 27 are given the same reference signs, and a redundant description thereof will be omitted.

As illustrated in FIG. 29, the RC-IGBT 400 includes the plurality of gate 101 trenches 14 (second gate trench), in addition to the plurality of gate trenches 3, in the IBGT region, and has a configuration in which one gate trench 14 is arranged between each pair of adjacent gate trenches 3. Note that the ratio of arrangement of the gate trenches 3 and the gate trenches 14 is not limited thereto.

The gate trenches 14 are provided extending in the thickness direction from the outermost surface of the base layer 5 through the base layer 5 and the carrier storage layer 6 to the inside of the drift layer 7. The emitter layer 4 is not provided outside the side faces of the gate trenches 14, and is provided only in contact with the gate trenches 3.

Each gate trench 3 has a two-stage structure including the gate electrode 11 and the gate electrode 12, whereas each gate trench 14 has a structure including the gate electrode 15 (third gate electrode). The gate electrode 15 is connected to the emitter potential.

The gate trench 14 has the same outside shape as that of the gate trench 3, and has a tapered side face that tapers down toward the bottom. Tapering the side face of the gate trench so as to narrow the bottom width thereof improves the embeddability of the gate electrode 15. If there is no problem with the embeddability of the gate electrode 15, this tapering is not an absolute necessity.

The inner face of the gate trench 14 is covered with the gate insulating film 16 (third gate insulating film), and the gate electrode 15 is provided in contact with the gate insulating film 16.

Moreover, the interlayer insulating film 2 is provided to cover the tops of the gate trenches 3 and 14, and the intervals between the gate trenches 14 and between the gate trenches 3 and 14, not covered with the interlayer insulating film 2, form the contact openings CH. The emitter electrode 1 is further provided to cover the interlayer insulating film 2 and the contact openings CH.

Since the gate trenches 14 are not in contact with the emitter layer 4 and the gate electrodes 15 are connected to the emitter potential, the gate trenches 14 do not function as gate trenches and thus can be referred to as "dummy gate trenches."

Since the gate electrodes 15 do not function as gate electrodes and do not form capacitance components with the base layer 5, the carrier storage layer 6, and the drift layer 7, it is possible to reduce feedback capacitances in a semiconductor chip as a whole.

The gate electrodes 15 are formed of phosphorus (P)-doped polysilicon or metal. Using the doped polysilicon or metal to form the gate electrodes reduces the resistances of the gate electrodes and reduces variations in potential in the plane of a semiconductor chip.

Fifth Preferred Embodiment

Figure 30:
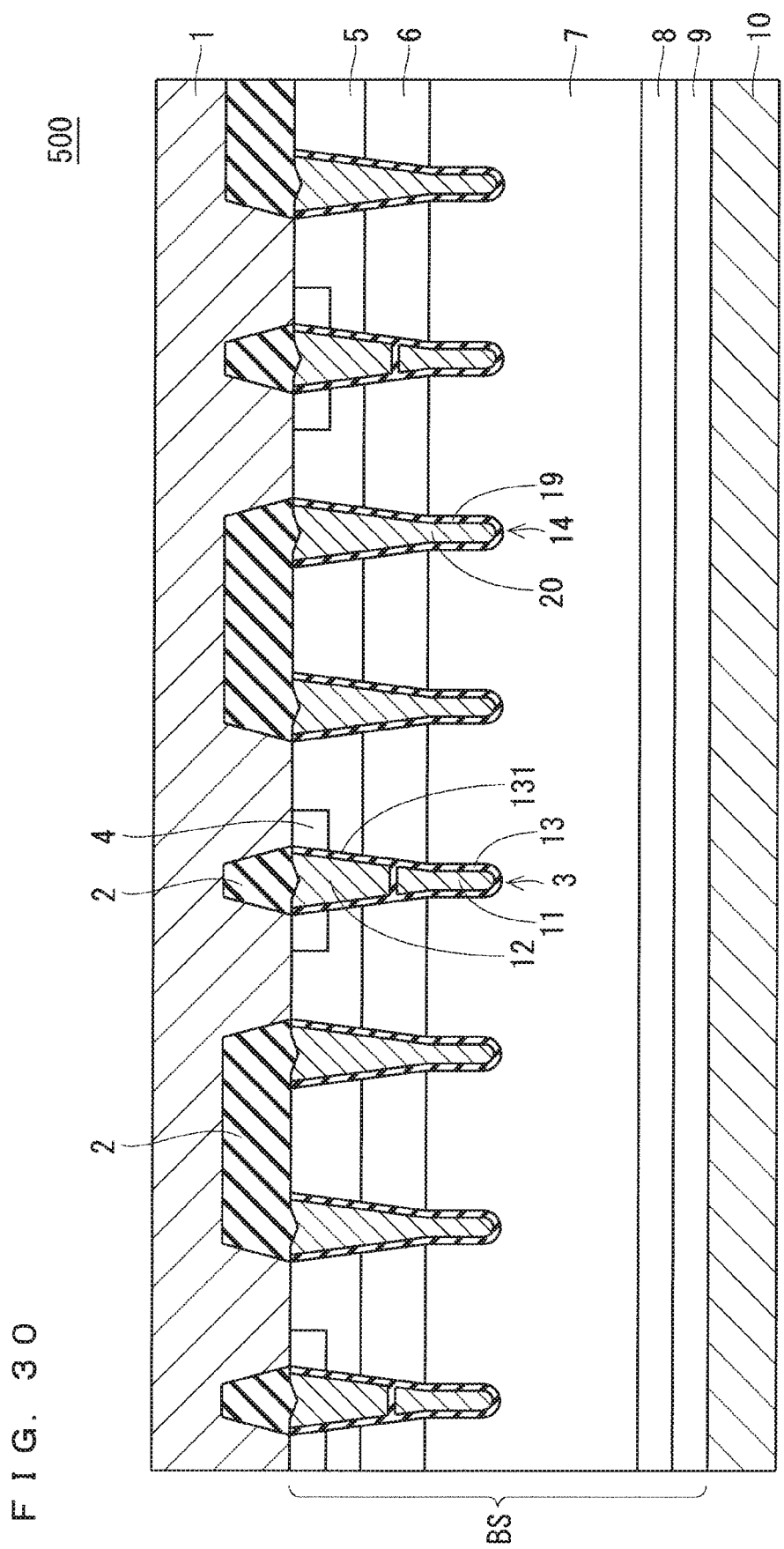
FIG. 30 is a sectional view illustrating a configuration of a semiconductor device according to a fifth preferred embodiment of the present invention.

FIG. 30 is a sectional view illustrating a sectional configuration of an IGBT 500 according to a fifth preferred embodiment of the present invention, the sectional view corresponding to the sectional view of the IGBT 100 illustrated in FIG. 2. In FIG. 30, constituent elements that are identical to those of the IGBT 200 described with reference to FIG. 26 are given the same reference signs, and a redundant description thereof will be omitted.

As illustrated in FIG. 30, the IGBT 500 is configured such that the interlayer insulating film 2 is also provided on each portion of the base layer 5 that is sandwiched between two gate trenches 14, and this portion of the base layer 5 that is sandwiched between the gate trenches 14 has a floating potential.

Since the top of the base layer 5 covered with the interlayer insulating film 2 does not form a contact opening CH, holes are less likely to come out into the emitter electrode 1. This increases the carrier density in the drift layer 7 as a result of injection enhancement effect (IE) and accordingly reduces the ON-state voltage.

Sixth Preferred Embodiment

Figure 31:
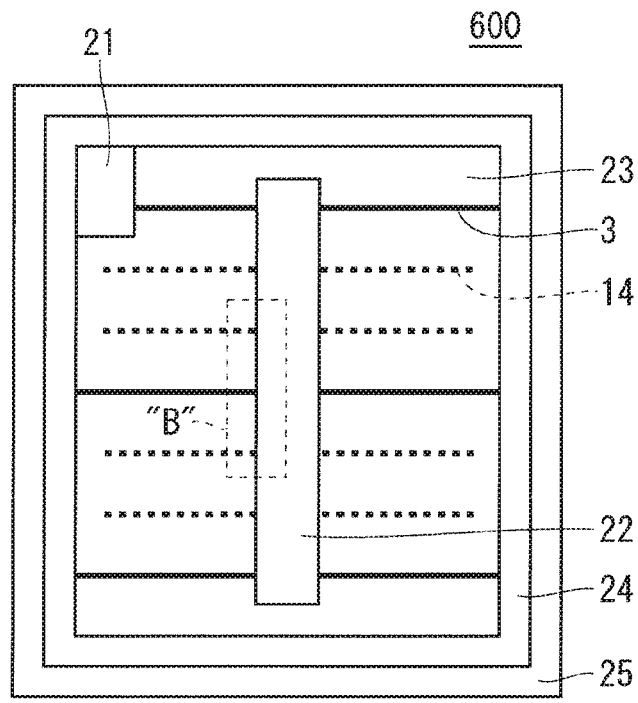
FIG. 31 is a plan view schematically illustrating a top configuration of a semiconductor device as a whole according to a sixth preferred embodiment of the present invention.

FIG. 31 is a plan view schematically illustrating a top configuration of an IGBT 600 as a whole according to a sixth preferred embodiment of the present invention. In FIG. 31, constituent elements that are identical to those of the IGBT 100 described with reference to FIG. 1 are given the same reference signs, and a redundant description thereof will be omitted.

The IGBT 600 illustrated in FIG. 31 has a sectional configuration similar to that of the IGBT 200 illustrated in FIG. 26, in which two gate trenches 14 are arranged between each pair of adjacent gate trenches 3.

The gate trenches 3 are connected to the gate line region 24 surrounding the active region 23, and the gate line region 24 is connected to the gate pad 21 provided in the active region 23. One ends of the gate trenches 3 are connected to the gate line region 24, and the other ends thereof extend to the line extraction region 22. One ends of the gate trenches 14 are not connected to the gate line region 24, and the other ends thereof extend to the line extraction region 22.

Figure 32:
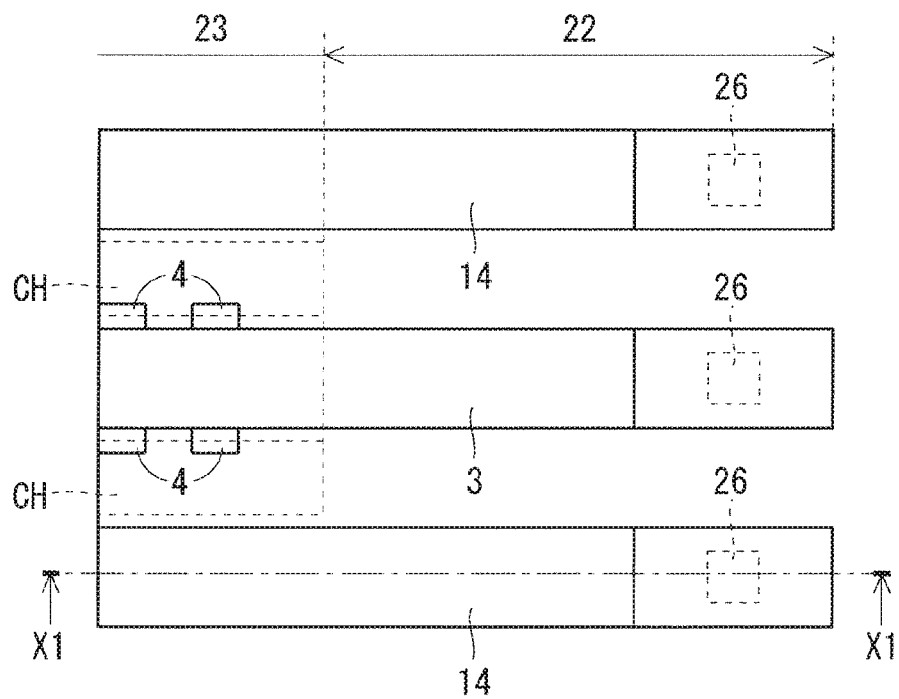
FIG. 32 is a plan view for describing a configuration of a line extraction region in the semiconductor device according to the sixth preferred embodiment of the present invention.
Figure 33:
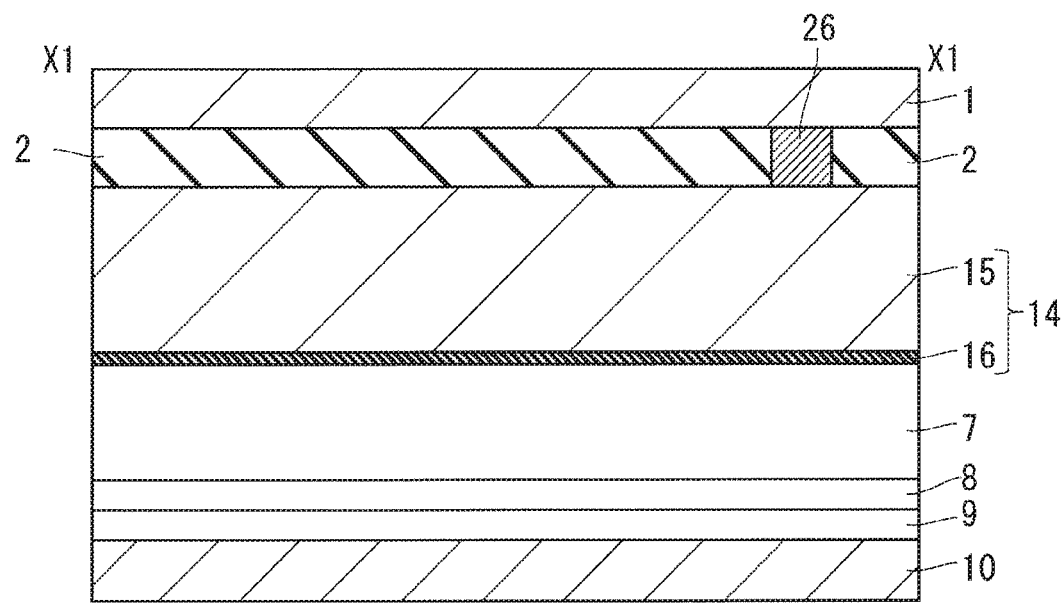
FIG. 33 is a partial sectional view for describing the configuration of the line extraction region in the semiconductor device according to the sixth preferred embodiment of the present invention.

FIG. 32 is a partial enlarged view of a region B that includes the line extraction region 22 in plat view in FIG. 31, and FIG. 33 is a sectional view taken along line X1-X1 and viewed in the direction indicated by arrows in FIG. 32.

Part of the line extraction region 22 and the active region 23 therearound are illustrated in FIG. 32. In the line extraction region 22, the gate trenches 3 and 14 have contact holes 26 at the ends. The contact holes 26 are connected to the emitter electrode 1 (not shown).

As illustrated in FIG. 33, each gate trench 14 includes the gate electrode 15 that is in contact with the interlayer insulating film 2, and the gate electrode 15 is connected to a contact hole 26 provided through the interlayer insulating film 2 in the thickness direction. Since the contact hole 26 is connected to the emitter electrode 1, the gate electrode 15 is connected to the emitter potential and stabilizes in terms of its potential. Each gate trench 3 has the same longitudinal sectional configuration as that in the IGBT 100 of the first preferred embodiment illustrated in FIG. 7, in which the gate electrode 11 is connected to the emitter potential at the end where the contact hole 26 is provided, and stabilizes in terms of its potential. The gate electrode 12 is electrically connected to the gate line region 24 at the end of the gate trench 3 on the side opposite the side where the contact hole 26 is provided.

By employing this configuration, it is possible to fix the potentials of the gate electrodes 11 and the gate electrodes 15 to the emitter potential and to stabilize these gate electrodes in terms of their potential. The presence of the line extraction region 22 in the central portion of the IGBT 600 eliminates the need to distribute the line extraction region 22.

Seventh Preferred Embodiment

Figure 34:
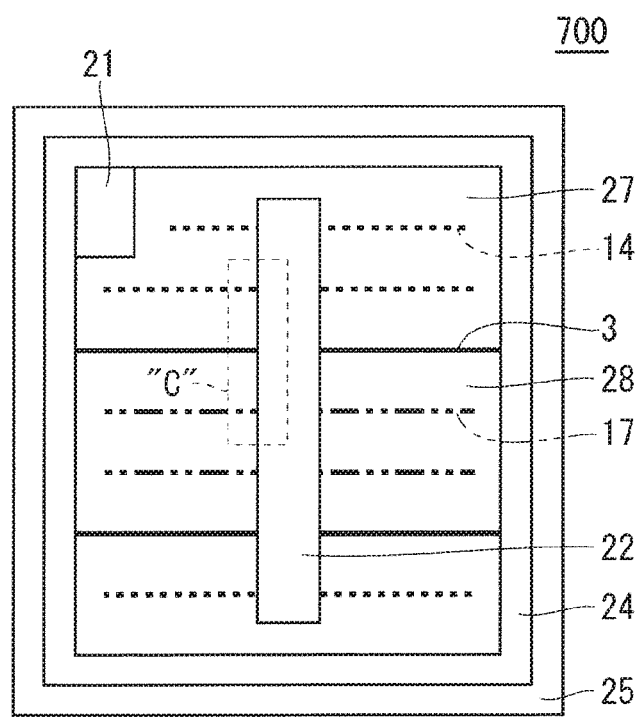
FIG. 34 is a plan view schematically illustrating a top configuration of a semiconductor device as a whole according to a seventh preferred embodiment of the present invention.

FIG. 34 is a plan view schematically illustrating a top configuration of an RC-IGBT 700 as a whole according to a seventh preferred embodiment of the present invention. The RC-IGBT 700 illustrated in FIG. 34 has a quadrangular outside shape, and its most part is configured of an IGBT active region 27 (first active regions) which a plurality of smallest unit structures (IGBT cells) of an IGBT is arranged, a diode active region 28 (second active region) in which a plurality of smallest unit structures (diode cells) of a diode is arranged, and a termination region 25 that surrounds the IGBT active region 27 and the diode active region 28. The IGBT active region 27 includes the gate trenches 3 and 14 that are arranged at intervals in parallel. The diode active region 28 includes the plurality of gate trenches 17 arranged at intervals in parallel. Note that the RE-IGBT 700 illustrated in FIG. 34 has a sectional configuration similar to that of the RC-IGBT 400 illustrated in FIG. 29.

The gate trenches 3 are connected to the gate line region 24 that surrounds the IGBT active region 27 and the diode active region 28, and the gate line region 24 is connected to the gate pad 21 provided in the IGBT active region 27. One ends of the gate trenches 3 are connected to the gate line region 24, and the other ends thereof extend to the rectangular line extraction region 22 provided extending in the direction of arrangement of the gate trenches 3, 14, and 17 in the central portion of the RC-IGBT 700. One ends of the gate trenches 14 are not connected to the gate line region 24, and the other ends thereof extend to the line extraction region 22. One ends of the gate trenches 17 are not connected to the gate line region 24, and the other ends thereof are connected to the line extraction region 22.

Figure 35:
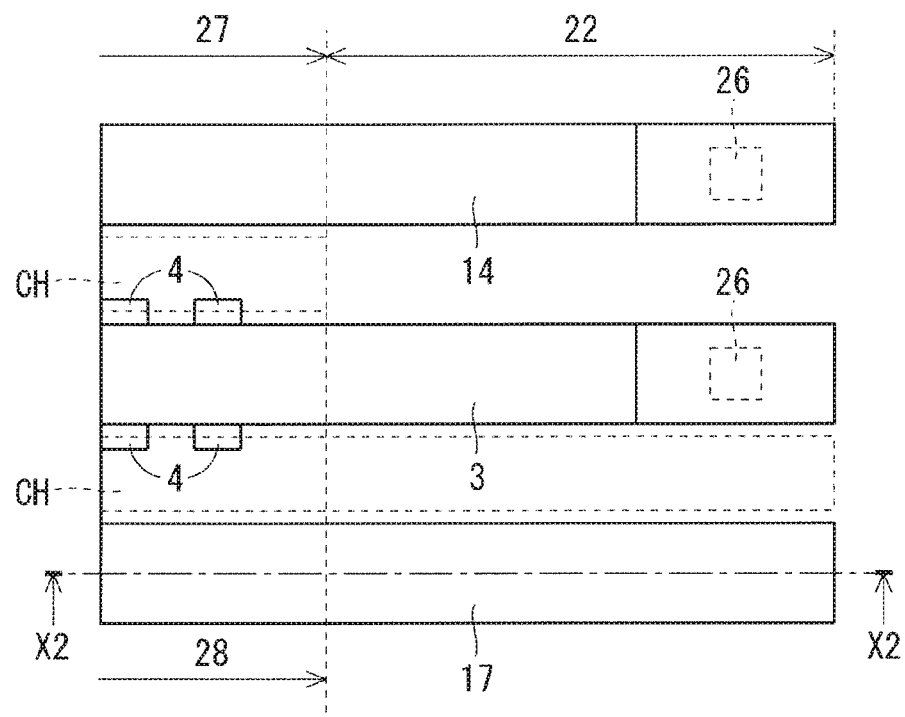
FIG. 35 is a plan view for describing a configuration of a line extraction region in the semiconductor device according to the seventh preferred embodiment of the present invention.
Figure 36:
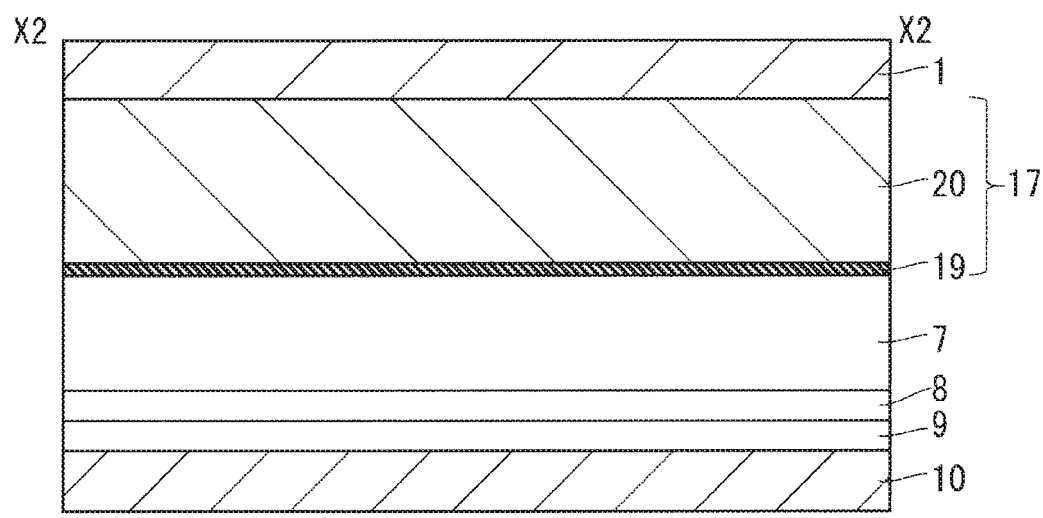
FIG. 36 is a partial sectional view for describing the configuration of the line extraction region in the semiconductor device according to the seventh preferred embodiment of the present invention.

FIG. 35 is a partial enlarged view of a region C that includes the line extraction region 22 in the plan view in FIG. 34, and FIG. 36 is a sectional view taken along line X2-X2 and viewed in the direction indicated by arrows in FIG. 32.

Part of the line extraction region 22, and the mar active region 27 and the diode active region 28 therearound are illustrated in FIG. 35. In the line extraction region 22, the gate trenches 3 and 14 have contact holes 26 at the ends. The contact holes 26 are connected to the emitter electrode 1 (not shown).

As illustrated in FIG. 36, the gate trenches 17 include the gate electrode 20 that is in direct contact with the emitter electrode 1.

Each gate trench 3 has a longitudinal sectional configuration similar to that in the IGBT 100 of the first preferred embodiment illustrated in FIG. 7, in which the gate electrode 11 is connected to the emitter potential at the end where the contact hole 26 is provided, and stabilizes in terms of its potential. The gate electrode 12 is electrically connected to the gate line region 24 at the end of the gate trench 3 on the side opposite the side where the contact hole 26 is provided.

Each gate trench 14 has a longitudinal sectional configuration similar to that in the IGBT 600 of the sixth preferred embodiment illustrated in FIG. 33, in which the gate electrode 11 is connected to the emitter potential at the end where the contact hole 26 is provided, and stabilizes in terms of its potential.

By employing this plan configuration, it is possible to fix the potentials of the gate electrodes 11, 15, and 20 to the emitter potential and to stabilize these gate electrodes in terms of their potential. Moreover, the presence of the line extraction region 22 in the central portion of the IGBT 700 eliminates the need to distribute the line extraction region 22.

Eighth Preferred Embodiment

Figure 37:
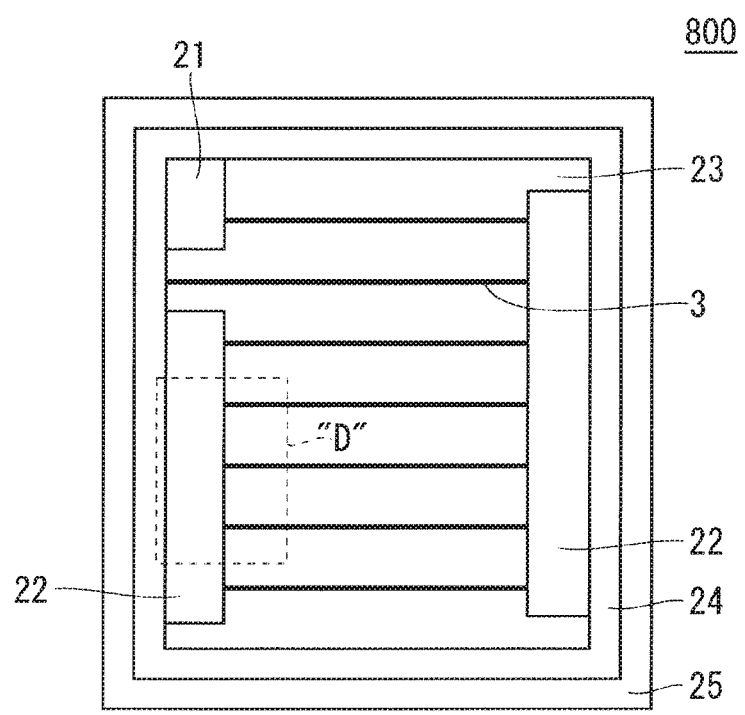
FIG. 37 is a plan view schematically illustrating a top configuration of a semiconductor device as a whole according to an eighth preferred embodiment of the present invention.

FIG. 37 is a plan view schematically illustrating a top configuration of an IGBT 800 as a whole according to an eighth preferred embodiment of the present invention. In FIG. 37, constituent elements that are identical to those of the IGBT 100 described with reference to FIG. 1 are given the same reference signs, and a redundant description thereof will be omitted.

The IGBT 800 illustrated in FIG. 37 has a sectional configuration similar to that of the IGBT 100 illustrated in FIG. 2, in which the plurality of gate trenches 3 is arranged at intervals in parallel in the active region 23.

In each of opposite edge portions of the active region 23 in the direction parallel to the direction of arrangement of the gate trenches 3, a rectangular line extraction region 22 is provided extending in the direction of arrangement of the gate trenches 3.

Although most of the gate trenches 3 have their opposite ends extending respectively to the opposite line extraction regions 22, some gate trenches 3 have only their one ends extending to one line extraction region 22 and their other ends connected to the gate line region 24, and some gate electrodes 3 have only their one ends extending to one line extraction region 22 and their other ends connected to the gate pad 21.

Figure 38:
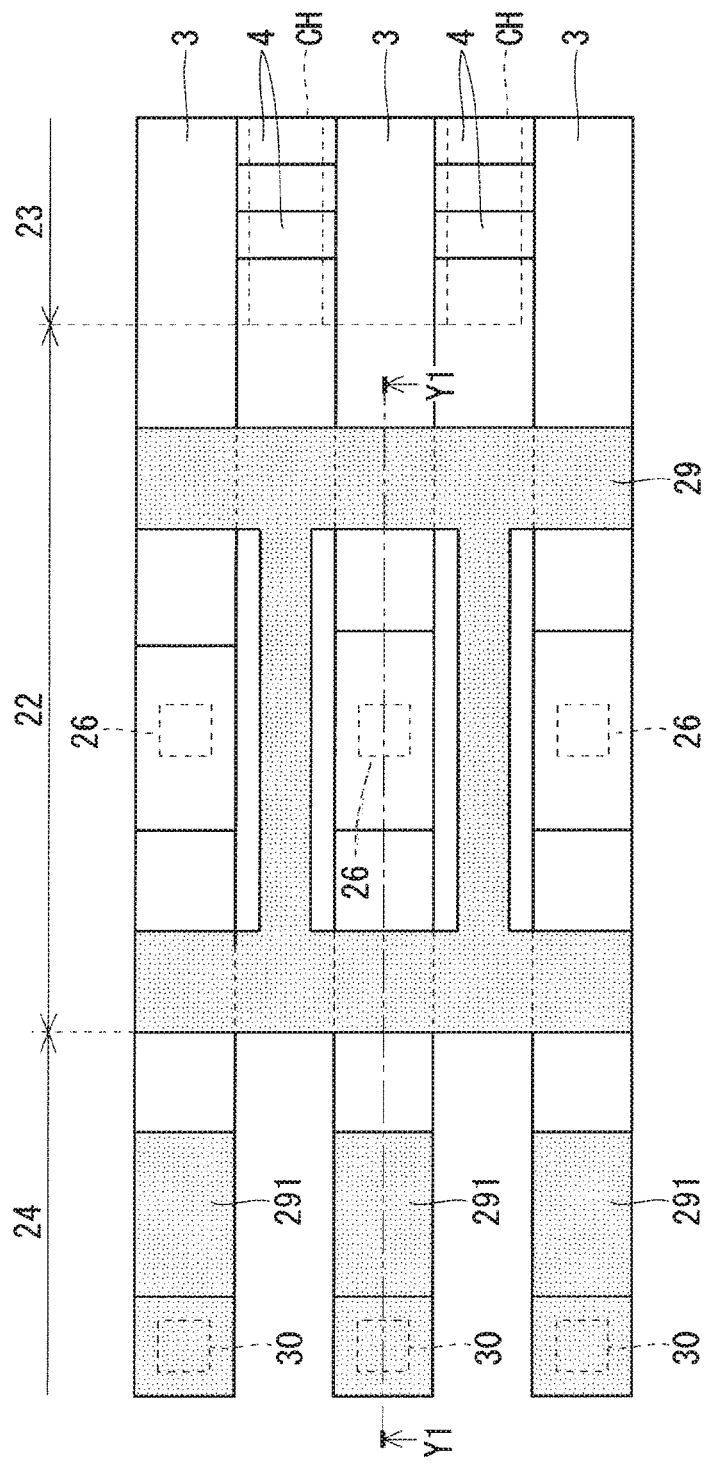
FIG. 38 is a plan view for describing a configuration of a line extraction region in the semiconductor device according to the eighth preferred embodiment of the present invention.
Figure 39:
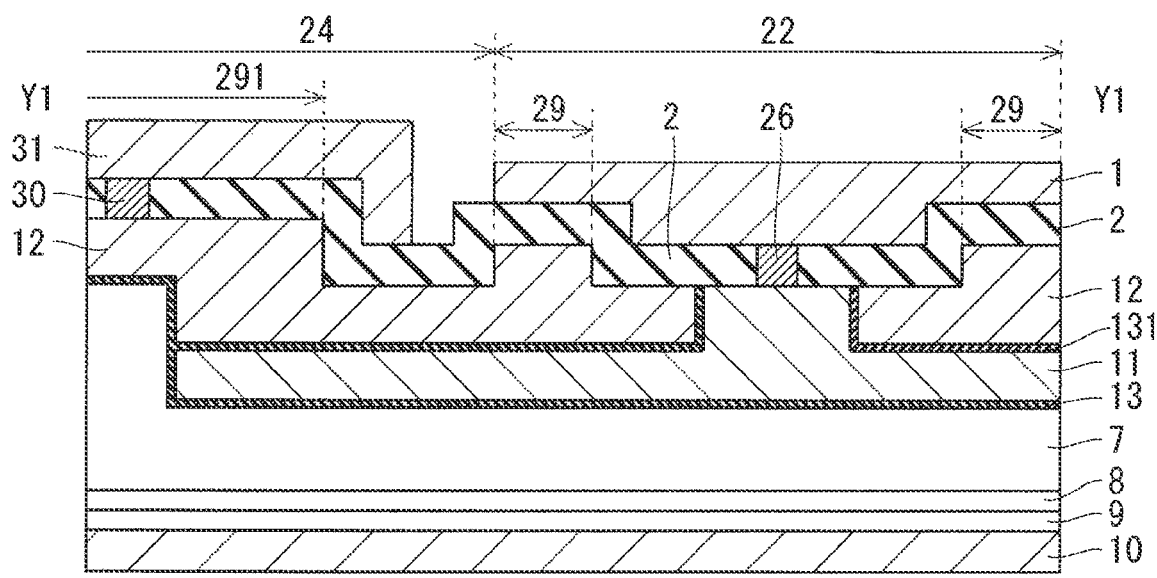
FIG. 39 is a partial sectional view for describing the configuration of the line extraction region in the semiconductor device according to the eighth preferred embodiment of the present invention.

FIG. 38 is a partial enlarged view of a region D that includes one line extraction region 22 in plan view in FIG. 37, and FIG. 39 is a sectional view taken along line Y1-Y1 and viewed in the direction indicated by arrows in FIG. 38.

Part of the line extraction region 22 and the active region 23 in the vicinity thereof are illustrated in FIG. 38. In the line extraction region 22, each gate trench 3 has a contact hole 26. The contact holes 26 are connected to the emitter electrode 1 (not shown).

In the line extraction region 22, a ladder line extraction structure 29 is provided to surround the contact holes 26, and the gate electrodes 12 of the gate trenches 3 are connected to the line extraction structure 29. In the end portion of each gate trench 3 in the gate line region 24, a line extraction structure 291 is provided and connected to a gate line 31 via a contact hole 30.

As illustrated in FIG. 39, in each gate trench 3, the gate electrode 11 extends upward so as to come into contact with the interlayer insulating film 2 in the portion where the contact hole 26 is provided, and is connected to the contact hole 26 extending in the thickness direction through the interlayer insulating 2. Since the contact hole 26 is connected to the emitter electrode 1, the gate electrode 11 is connected to the emitter potential and stabilizes in terms of its potential. The gate electrode 12 is electrically isolated from the gate electrode 11 by the gate insulating film 131.

In each gate trench 3, the line extraction structure 29 is provided to surround the contact hole 26. The line extraction structure 29 is configured of the same material as the gate electrode 12 and formed protruding upward of the gate electrode 12 so as to electrically connect the gate electrode 12 that is divided in the portion where the contact hole 26 is provided. The line extraction structure 29 is covered with the interlayer insulating film 2.

The gate electrodes 11 and 12 extend to the gate line region 24, and the ends of the gate electrodes 12 are connected to the line extraction structures 291 in the gate line region 24. The line extraction structures 291 are configured of the same material as the gate electrodes 12, formed protruding upward of the gate electrodes 12, and covered with the interlayer insulating film 2. In the end portions of the line extraction structures 291, the contact holes 30 are provided extending in the thickness direction through the interlayer insulating film 2 and connected to the gate lines 31 provided on the interlayer insulating film 2. The gate lines 31 are located in the same layer as the emitter electrode 1, but electrically isolated from the emitter electrode 1.

By employing this plan configuration, it is possible to fix the potential of the gate electrodes 11 to the emitter potential and to stabilize these gate electrodes in terms of their potential. Since the gate electrodes 12 are connected to one another via the line extraction structure 29, it is possible to stabilize potential balance among the gate trenches 3. With the presence of the line extraction regions 22 in the opposite edge portions of the active region 23, it is possible to fix the potentials of the gate electrodes 11 and 12 at the opposite ends of the gate trenches 3, which is effective when the gate trenches 3 are long.

Ninth Preferred Embodiment

Figure 40:
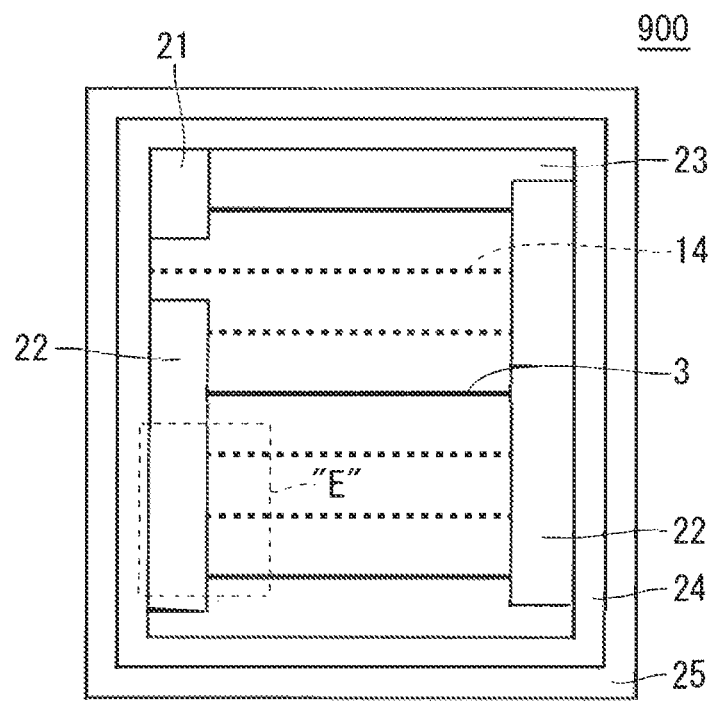
FIG. 40 is a plan view schematically illustrating a top configuration of a semiconductor device as a whole according to a ninth preferred embodiment of the present invention.

FIG. 40 is a plan view schematically illustrating a top configuration of an IGBT 900 as a whole according to a ninth preferred embodiment of the present invention. In FIG. 40, constituent elements that are identical to those of the IGBT 100 described with reference to FIG. 1 are given the same reference sims, and a redundant description thereof will be omitted.

The IGBT 900 illustrated in FIG. 40 has a sectional configuration similar to that of the IGBT 200 illustrated in FIG. 26, in which two gate trenches 14 are arranged between each pair of adjacent gate trenches 3.

In each of the opposite edge portions of the active region 23 in the direction parallel to the direction of arrangement of the gate trenches 3 and 14, a rectangular line extraction region 22 is provided extending in the direction of arrangement of the gate trenches 3 and 14.

Although most of the gate trenches 3 and 14 have their opposite ends extending respectively to the opposite line extraction regions 22, some gate trenches 14 have only their one ends extending to one line extraction region 22 and their other ends not connected to the gate line region 24, and some gate trenches 3 have only their one ends extending to one line extraction region 22 and their other ends connected to the gate pad 21.

Figure 41:
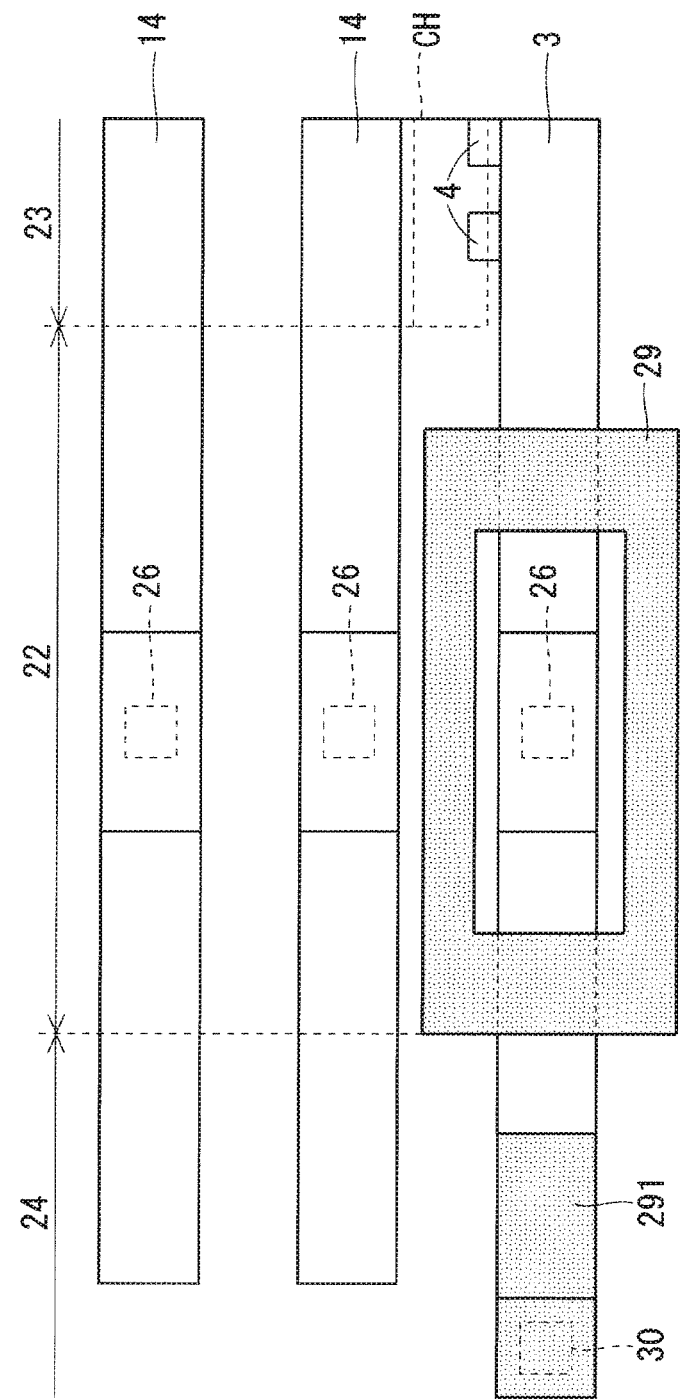
FIG. 41 is a plan view for describing a configuration of a line extraction region in the semiconductor device according to the ninth preferred embodiment of the present invention.

FIG. 41 is a partial enlarged view of a region E that includes one line extraction region 22 in the plan view in FIG. 40. Part of the line extraction region 22 and the active region 23 in the vicinity thereof are illustrated in FIG. 41. In the line extraction region 22, the gate trenches 3 and 14 each have the contact hole 26. The contact holes 26 are connected to the emitter electrode 1 (not shown).

In the line extraction region 22, the line extraction structure 29 is provided to surround the contact hole 26 of each gate trench 3, and the gate electrode 12 in the gate trench 3 is connected to the line extraction structure 29. In the end portion of each gate trench 3 in the gate line region 24, the line extraction structure 291 is provided and connected to the gate line 31 (not shown) via the contact hole 30.

The gate trenches 3 have the same longitudinal sectional configuration as that in the IGBT 800 of the eighth preferred embodiment illustrated in FIG. 39. The gate trenches 14 have the same longitudinal sectional configuration as that in the IGBT 600 according to the sixth preferred embodiment illustrated in FIG. 33.

By employing this plan configuration, it is possible to fix the potentials of the gate electrodes 11 and 15 to the emitter potential and to stabilize these gate electrodes in terms of their potential. Since the gate electrodes 12 are connected to one another via the line extraction structure 29, it is possible to stabilize potential balance among the gate trenches 3. Moreover, with the presence of the line extraction structure 29, it is possible to electrically connect the gate electrodes 12 that are divided in the portions where the contact holes 26 are provided. Furthermore, with the presence of the line extraction regions 22 in the opposite edge portions of the active region 23, it is possible to fix the potentials of the gate electrodes 11 and 12 at the opposite ends of the gate trenches 3, which is effective when the gate trenches 3 are long.

Tenth Preferred Embodiment

Figure 42:
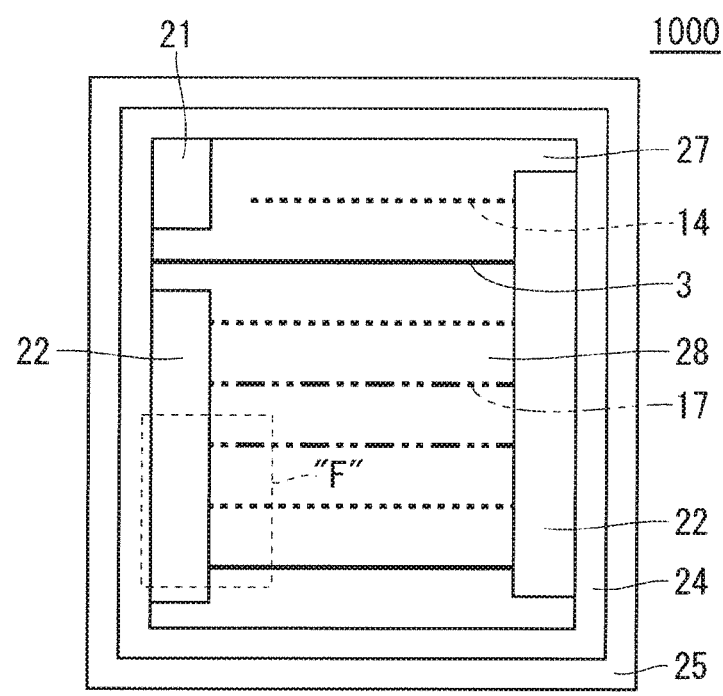
FIG. 42 is a plan view schematically illustrating a top configuration of a semiconductor device as a whole according to a tenth preferred embodiment of the present invention.

FIG. 42 is a plan view schematically illustrating a top configuration of an RC-IGBT 1000 as a whole according to a tenth preferred embodiment of the present invention. In FIG. 42, constituent elements that are identical to those of the RC-IGBT 700 described with reference to FIG. 34 are given the same reference signs, and a redundant description thereof will be omitted.

The RC-IGBT 1000 illustrated in FIG. 42 has a sectional configuration similar to that of the RC-IGBT 400 illustrated in FIG. 29.

In each of the opposite edge portions of the IGBT active region 27 and the diode active region 28 in the direction parallel to the direction of arrangement of the gate trenches 3, 14, and 17, the rectangular line extraction region 22 is provided extending in the direction of arrangement of the gate trenches 3, 14, and 17.

The gate trenches 3 include those that have their one ends connected to the gate line region 24 surrounding the IGBT active region 27 and the diode active region 28 and their other ends connected to one line extraction region 22, and those that have their opposite ends extending respectively to the opposite line extraction regions 22.

The gate trenches 14 include those that have only their one ends extending to one line extraction region 22 and their other ends not connected to the gate line region 24, and those that have their opposite ends extending respectively to the opposite line extraction regions 22. The gate trenches 17 have their opposite ends extending respectively to the opposite line extraction regions 22.

Figure 43:
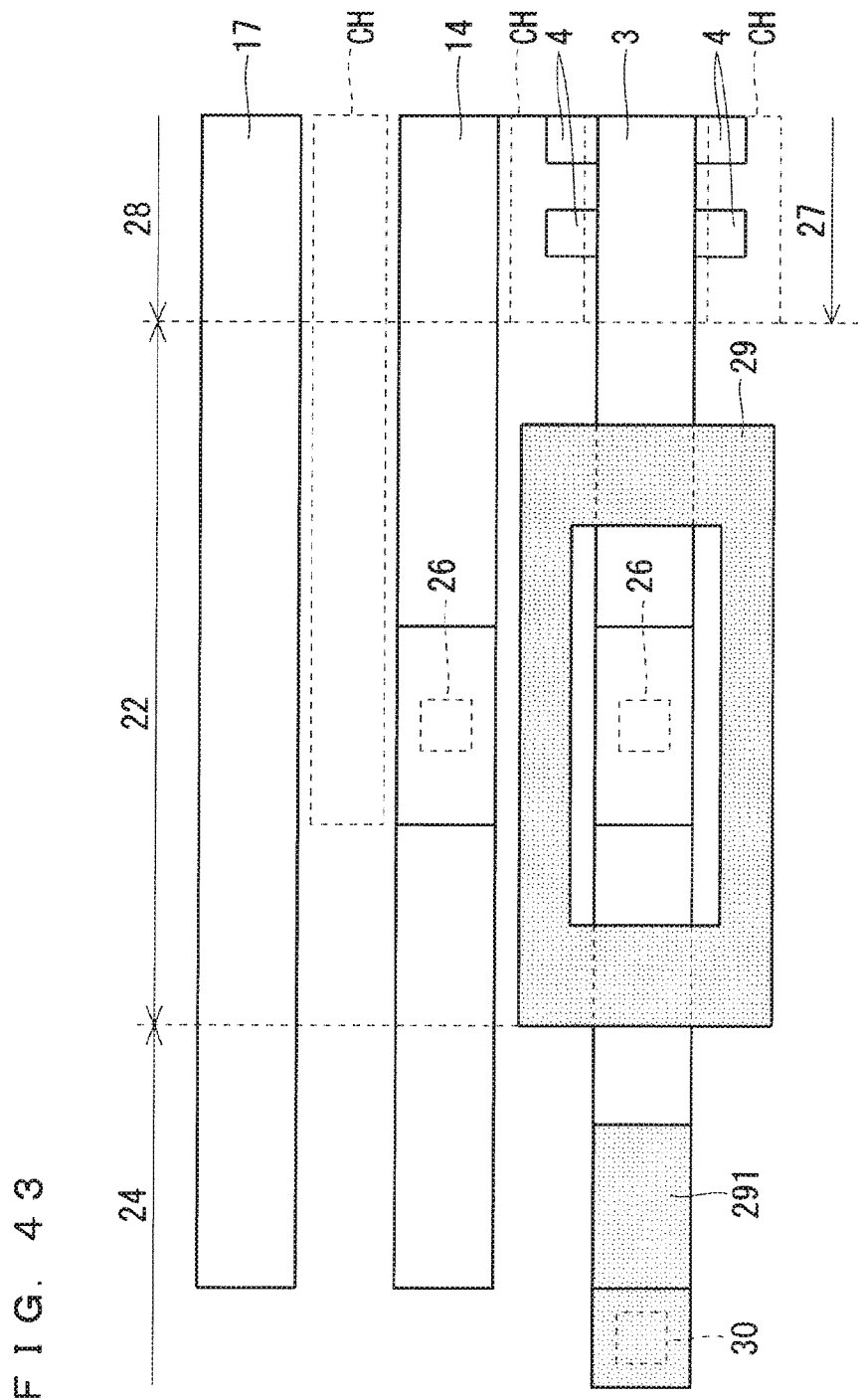
FIG. 43 is a plan view for describing a configuration of a line extraction region in the semiconductor device according to the tenth preferred embodiment of the present invention.

FIG. 43 is a partial enlarged view of a region F that includes one line extraction region 22 in the plan view in FIG. 42. Part of the line extraction region 22, and the IGBT active region 27 and the diode active region 28 in the vicinity thereof are illustrated in FIG. 43. In the line extraction region 22, the gate trenches 3 and 14 each have a contact hole 26. The contact holes 26 are connected to the emitter electrode 1 (not shown).

The line extraction structure 29 is provided to surround the contact hole 26 of each gate trench 3 over the range from above the line extraction region 22 to above the gate line region 24, and the gate electrode 12 in the gate trench 3 is connected to the line extraction structure 29. Also, the line extraction structure 291 is provided in the end portion of the gate trench 3 in the gate line region 24. The line extraction structure 291 is connected to the gate line 31 (not shown) via the contact hole 30.

The gate trenches 3 have the same longitudinal sectional configuration as that in the IGBT 800 of the eighth preferred embodiment illustrated in FIG. 39. The gate trenches 14 have the same longitudinal sectional configuration as that in the IGBT 600 of the sixth preferred embodiment illustrated in FIG. 33. The gate trenches 17 have the same longitudinal sectional configuration as that in the RC-IGBT 700 of the seventh preferred embodiment illustrated in FIG. 36.

By employing this plan configuration, it is possible to fix the potentials of the gate electrodes 11 and 15 to the emitter potential and to stabilize these gate electrodes in terms of their potential. Since the gate electrodes 12 are connected to the line extraction structure 29, it is possible to stabilize potential balance among the gate trenches 3. Moreover, with the presence of the line extraction structure 29, it is possible to electrically connect the gate electrodes 12 that are divided in the portions where the contact holes 26 are provided. Furthermore, with the presence of the line extraction regions 22 in the opposite edge portions of the IGBT active region 27 and the diode active region 28, it is possible to fix the potentials of the gate electrodes 11 and 12 at the opposite ends of the gate trenches 3, which is effective when the gate trenches 3 are long.

OTHER EXAMPLES OF APPLICATION

While the above-described embodiments take the example of the cases where the present invention is applied to the IGBTs or the RC-IGBTs, hut the present invention is not limited thereto. The present invention is also applicable to metal oxide semiconductor field effect transistors (MOSs) as long as the transistors are of an insulated-gate type, and is applicable irrespective of the withstand voltage class or the type of substrates such as FZ substrates formed by floating zone methods, MCZ substrates formed by magnetic field applied methods, and epitaxial substrates formed by epitaxial methods.

It should be noted that the present invention can be implemented by freely combining each embodiment or by making modification or omission as appropriate on the embodiments without departing from the scope of the present invention.

What is claimed is:
1. A semiconductor device comprising:
a semiconductor substrate including at least a first semiconductor layer of a first conductivity type, a second semiconductor layer of the first conductivity type provided on the first semiconductor layer, a third semiconductor layer of a second conductivity type provided on the second semiconductor layer, and a fourth semi- conductor layer of the first conductivity type provided in an upper layer portion of the third semiconductor layer;

a first gate trench extending in a thickness direction of the semiconductor substrate through the fourth semiconductor layer, the third semiconductor layer, and the second semiconductor layer to an inside of the first semiconductor layer;

an interlayer insulating film covering at least the first gate trench;

a first main electrode provided in contact with the fourth semiconductor layer; and a second main electrode provided on a side of the semiconductor substrate opposite the first main electrode in the thickness direction, wherein the first gate trench has a two-stage structure that includes a first gate electrode provided on a lower side close to the second main electrode, and a second gate electrode provided on an upper side close to the first main electrode, the first gate electrode is electrically connected to the first main electrode, an inner face of the first gate trench on the lower side is covered with a first gate insulating film, an upper face of the first gate electrode and a side face of the first gate trench on the upper side are covered with a second gate insulating film, and the first gate insulating film has a thickness smaller than a thickness of the second gate insulating film.

2. The semiconductor device according to claim 1, wherein
the second gate electrode has a bottom face located in the second semiconductor layer in the thickness direction of the semiconductor substrate, and
the first gate electrode has an upper face opposing the bottom face of the second gate electrode via the second gate insulating film, and has a bottom face opposing the first semiconductor layer via the first gate insulating film.

3. The semiconductor device according to claim 2, wherein
the first gate electrode has a protrusion toward the second gate electrode in a center of the upper face.

4. The semiconductor device according to claim 1, wherein
the first gate trench has a bottom width smaller than its uppermost opening width and has a tapered side face that tapers down toward the bottom width.

5. The semiconductor device according to claim 1, further comprising:
a second gate trench extending in the thickness direction through the third semiconductor layer and the second semiconductor layer to the inside of the first semiconductor layer,
wherein the second gate trench includes:
a third gate insulating film covering an inner face of the second gate trench; and
a third gate electrode provided in contact with the third gate insulating film,
the third gate electrode is electrically connected to the first main electrode, and
the fourth semiconductor layer is selectively provided not to come in contact with the second gate trench.

6. The semiconductor device according to claim 5, wherein
the second gate trench includes a plurality of second gate trenches arranged adjacent to each other, and
an interval between adjacent ones of the second gate trenches is covered with the interlayer insulating film to keep a potential of the third semiconductor layer between the second gate trenches adjacent to each other at a floating potential.

7. The semiconductor device according to claim 5, wherein
a plurality of first gate trenches, each being the first gate trench, is arranged at an interval in an active region through which principal current flows, the first gate trenches having longitudinal directions parallel to each other,
the second gate trench is arranged parallel to and between the first gate trenches,
at one end of the first gate trench in the longitudinal direction, the second gate electrode is connected to a gate line region provided along an outer periphery of the active region,
at the other end of the first gate trench in the longitudinal direction, the first gate electrode is connected to the first main electrode via a contact hole provided through the interlayer insulating film,
at one end of the second gate trench in the longitudinal direction, the third gate electrode is connected to the first main electrode via a contact hole provided through the interlayer insulating film, and
the other end of the first gate trench and the one end of the second gate trench extend to a line extraction region provided in a central portion of the active region.

8. The semiconductor device according to claim 5, wherein
a plurality of first gate trenches, each being the first gate trench, is arranged at an interval in an active region through which principal current flows, the first gate trenches having longitudinal directions parallel to each other,
the second gate trench is arranged parallel to and between the first gate trenches,
at one and the other ends of the first gate trenches in the longitudinal direction, a plurality of second gate electrodes, each being the second gate electrode, is connected to each other via a line extraction structure provided over tops of the plurality of first gate trenches,
at one and the other ends of the first gate trench in the longitudinal direction, the first gate electrode is connected to the first main electrode via contact holes provided through the interlayer insulating film,
at one and the other ends of the second gate trench in the longitudinal direction, the third gate electrode is connected to the first main electrode via contact holes formed through the interlayer insulating film,
the one and the other ends of the first and second gate trenches extend to line extraction regions provided adjacent respectively to gate line regions provided at the one and the other ends of the first and second gate trenches, the line extraction regions extending in a direction of arrangement of the first and second gate trenches, and
the line extraction structure is provided in the line extraction regions.

9. The semiconductor device according to claim 5, wherein
the second gate trench has a bottom width smaller than an opening width and has a tapered side face that tapers down toward a bottom.

10. The semiconductor device according to claim 5, wherein
the third gate electrode is formed of phosphorus-doped polysilicon or metal.

11. The semiconductor device according to claim 1, wherein
the semiconductor substrate includes:
a fifth semiconductor layer of the second conductivity type; and
a sixth semiconductor layer of the first conductivity type,
the fifth semiconductor layer and the sixth semiconductor layer being in contact with the second main electrode,
a region where the fifth semiconductor layer is provided constitutes a first semiconductor element region,
a region where the sixth semiconductor layer is provided constitutes a second semiconductor element region,
the first gate trench is provided in the first semiconductor element region,
the first semiconductor element region further incudes a second gate trench that extends in the thickness direction through the third semiconductor layer and the second semiconductor layer to the inside of the first semiconductor layer,
the second gate trench includes:
a third gate insulating film covering an inner face of the second gate trench; and
a third gate electrode provided in contact with the third gate insulating film,
in the second semiconductor element region, the fourth semiconductor layer is not provided, and the first main electrode is provided in contact with the third semiconductor layer,
the second semiconductor element region includes a third gate trench that extends in the thickness direction through the third semiconductor layer and the second semiconductor layer to the inside of the first semiconductor layer,
the third gate trench includes:
a fourth gate insulating film covering an inner face of the third gate trench; and
a fourth gate electrode provided in contact with the fourth gate insulating film, and
the fourth gate electrode has an upper face that is in contact with the first main electrode.

12. The semiconductor device according to claim 11, wherein
the fifth semiconductor layer has a projecting portion projecting toward the second semiconductor element region beyond a position of an end face of the fourth semiconductor layer.

13. The semiconductor device according to claim 11, wherein
the first semiconductor element region further includes a second gate trench that extends in the thickness direction of the semiconductor substrate through the third semiconductor layer and the second semiconductor layer to the inside of the first semiconductor layer,
the second gate trench includes:
a third gate insulating film covering an inner face of the second gate trench; and
a third gate electrode provided in contact with the third gate insulating film, and
the fourth semiconductor layer is selectively provided, not to come in contact with the second gate trench.

14. The semiconductor device according to claim 13, wherein
the second gate trench includes a plurality of second gate trenches arranged adjacent to each other, and
an interval between adjacent ones of the second gate trenches is covered with the interlayer insulating film to keep a potential of the third semiconductor layer between the second gate trenches adjacent to each other at a floating potential.

15. The semiconductor device according to claim 13, wherein
the second gate trench has a bottom width smaller than its uppermost opening width and has a tapered side face that tapers down toward the bottom width.

16. The semiconductor device according to claim 13, wherein
the third gate electrode is formed of phosphorus-doped polysilicon or metal.

17. The semiconductor device according to claim 11, wherein
a plurality of first gate trenches, each being the first gate trench, is provided at an interval in a first active region of the first semiconductor element region, the first gate trenches having longitudinal directions parallel to each other,
the second gate trench is arranged parallel to and between the first gate trenches,
a plurality of third gate trenches, each being the third gate trench, is provided at an interval in a second active region of the second semiconductor element region, the third gate trenches having longitudinal directions parallel to each other,
at one end of the first gate trench in the longitudinal direction, the second gate electrode is connected to a gate line region provided along outer peripheries of the first and second active regions,
at the other end of the first gate trench in the longitudinal direction, the first gate electrode is connected to the first main electrode via a contact hole provided through the interlayer insulating film,
at one end of the second gate trench in the longitudinal direction, the third gate electrode is connected to the first main electrode via a contact hole provided through the interlayer insulating film,
the fourth gate electrode is connected to the first main electrode on an entire surface of the third gate trench, and
the other end of the first gate trench, the one end of the second gate trench, and one end of the third gate trench extend to a line extraction region provided in central portions of the first and second active regions.

18. The semiconductor device according to claim 11, wherein
a plurality of first gate trenches, each being the first gate trench, is arranged at an interval in a first active region of the first semiconductor element region, the first gate trenches having longitudinal directions parallel to each other,
the second gate trench is provided parallel to and between the first gate trenches,
a plurality of third gate trenches, each being the third gate trench, is arranged at an interval in a second active region of the second semiconductor element region, the third gate trenches having longitudinal directions parallel to each other,
at one and the other ends of the first gate trenches in the longitudinal direction, a plurality of second gate electrodes, each being the second gate electrode, is connected to each other via a line extraction structure provided over tops of the plurality of first gate trenches, at one and the other ends of the first gate electrode in the longitudinal direction, the first gate electrode is connected to the first main electrode via contact holes provided through the interlayer insulating film, at one and the other ends of the second gate trench in the longitudinal direction, the third gate electrode is connected to the first main electrode via contact holes provided through the interlayer insulating film, the fourth gate electrode is connected to the first main electrode on an entire surface of the third gate trench, the one end and the other end of the first and second gate trenches extend to line extraction regions provided adjacent respectively to gate line regions provided at the one ends and the other ends of the first and second gate trenches, the line extraction regions extending in a direction of arrangement of the first and second gate trenches, and the line extraction structure is provided in the line extraction regions.

19. The semiconductor device according to claim 11, wherein
the third gate trench has a bottom width smaller than its uppermost opening width and has a tapered side face that tapers down toward the bottom width.

20. The semiconductor device according to claim 11, wherein
the fourth gate electrode is formed of phosphorus-doped polysilicon or metal.

21. The semiconductor device according to claim 1, wherein
a plurality of first gate trenches, each being the first gate trench, is arranged at an interval in an active region through which principal current flows, the first gate trenches having longitudinal directions parallel to each other, at one end of the first gate trench in the longitudinal direction, the second gate electrode is connected to a gate line region provided along an outer periphery of the active region, at the other end of the first gate trench in the longitudinal direction, the first gate electrode is connected to the first main electrode via a contact hole provided through the interlayer insulating film, and the other end of the first gate trench extends to a line extraction region provided in a central portion of the active region.

22. The semiconductor device according to claim 1, wherein
a plurality of first gate trenches, each being the first gate trench, is provided at an interval in an active region through which principal current flows, the first gate trenches having longitudinal directions parallel to each other, at one and the other ends of the first gate trenches in the longitudinal direction, a plurality of second gate electrodes, each being the second gate electrode, is connected to each other via a line extraction structure provided over tops of the plurality of first gate trenches, at one and the other ends of the first gate trench in the longitudinal direction, the first gate electrode is connected to the first main electrode via contact holes provided through the interlayer insulating film, the one and the other ends of the first gate trench extend respectively to line extraction regions provided adjacent respectively to gate line regions provided at the one and the other ends of the first gate trench, the line extraction regions extending in a direction of arrangement of the first gate trenches, and the line extraction structure is provided in the line extraction regions.

23. The semiconductor device according to claim 1, wherein
the first and second gate electrodes are formed of phosphorus-doped polysilicon or metal.

24. A method of manufacturing a semiconductor device including a gate trench, the method comprising:
(a) forming a trench by etching a semiconductor substrate in a thickness direction;
(b) forming a first gate insulating film on an inner face of the trench;
(c) forming a first gate electrode by depositing phosphorus-doped polysilicon or metal on an inside of the trench on which the first gate insulating film is provided;
(d) etching the first gate electrode to leave the first gate electrode in a lower portion of the trench;
(e) after the operation (d), etching the first gate insulating film to remove a portion of the first gate insulating film that is above the first gate electrode;
(f) with the first gate electrode remaining in the lower portion of the trench after the operation (d), forming a second gate insulating film on an inner face of the trench and on an upper face of the first gate electrode; and
(g) forming a second gate electrode by depositing phosphorus-doped polysilicon or metal on an inside of the trench on which the second gate insulating film is provided,
wherein the operation (b) is to form the first gate insulating film under a formation condition that the first gate insulating film has a thickness smaller than a thickness of the second gate insulating film.

* * * * *